(12) United States Patent
Kim et al.

(10) Patent No.: US 10,842,042 B2
(45) Date of Patent: Nov. 17, 2020

(54) COOLING DEVICE FOR SURVEILLANCE CAMERA

(71) Applicant: Hanwha Techwin Co., Ltd., Seongnam-si (KR)

(72) Inventors: Sin Hyun Kim, Seongnam-si (KR); Ji Seok Kim, Seongnam-si (KR); Se Ra Hong, Seongnam-si (KR)

(73) Assignee: HANWHA TECHWIN CO., LTD., Seongnam-si (KR)

( * ) Notice: Subject to any disclaimer, the term of this patent is extended or adjusted under 35 U.S.C. 154(b) by 0 days.

(21) Appl. No.: 16/380,184

(22) Filed: Apr. 10, 2019

(65) Prior Publication Data

US 2019/0239383 A1 Aug. 1, 2019

Related U.S. Application Data

(63) Continuation of application No. PCT/KR2016/015477, filed on Dec. 29, 2016.

(30) Foreign Application Priority Data

Oct. 10, 2016 (KR) .......................... 10-2016-0130828

(51) Int. Cl.
*H05K 7/20* (2006.01)
*G08B 13/196* (2006.01)
(Continued)

(52) U.S. Cl.
CPC ... *H05K 7/20172* (2013.01); *G08B 13/19634* (2013.01); *H04N 5/225* (2013.01);
(Continued)

(58) Field of Classification Search
CPC .......... H05K 7/20172; H05K 7/20145; H05K 7/20136–20154; G08B 13/19634
See application file for complete search history.

(56) References Cited

U.S. PATENT DOCUMENTS 4,320,949 A * 3/1982 Pagano .................. G03B 17/08
219/201
5,394,184 A * 2/1995 Anderson .............. G03B 17/55
348/151
(Continued)

FOREIGN PATENT DOCUMENTS

JP 3705017 B2 10/2005
JP 4257317 B2 4/2009
(Continued)

OTHER PUBLICATIONS

International Search Report (PCT/ISA/210) dated Jul. 3, 2017 issued by the International Searching Authority in International Application No. PCT/KR2016/015477.
(Continued)

*Primary Examiner* — Binh B Tran
*Assistant Examiner* — Michael A Matey
(74) *Attorney, Agent, or Firm* — Sughrue Mion, PLLC

(57) ABSTRACT

A cooling device for surveillance system includes: an outer housing surrounding a surveillance camera; and a blower positioned on an outer surface of the outer housing and configured to generate cooling air flowing along the outer surface of the outer housing.

18 Claims, 21 Drawing Sheets

(51) Int. Cl.
*H04N 7/18* (2006.01)
*H04N 5/225* (2006.01)
(52) U.S. Cl.
CPC ........... *H04N 7/18* (2013.01); *H05K 7/20145* (2013.01); *H05K 7/20154* (2013.01)

(56) References Cited

U.S. PATENT DOCUMENTS

| | | | | |
|---|---|---|---|---|
| 6,354,749 | B1* | 3/2002 | Pfaffenberger, II | G03B 17/00 |
| | | | | 348/143 |
| 6,992,723 | B1* | 1/2006 | Wulf | G08B 13/19619 |
| | | | | 348/144 |
| 8,537,549 | B2 | 9/2013 | Alm et al. | |
| 2005/0213960 | A1* | 9/2005 | Baldwin | G03B 17/02 |
| | | | | 396/439 |
| 2005/0276599 | A1* | 12/2005 | Kajino | H04N 5/2252 |
| | | | | 396/419 |
| 2007/0183772 | A1 | 8/2007 | Baldwin et al. | |
| 2007/0194170 | A1* | 8/2007 | Ellison | F16M 11/10 |
| | | | | 244/3.1 |
| 2008/0024604 | A1* | 1/2008 | Menegotto | G08B 13/19619 |
| | | | | 348/143 |
| 2011/0205703 | A1* | 8/2011 | Weaver | G03B 15/006 |
| | | | | 361/695 |
| 2012/0177357 | A1* | 7/2012 | Lee | G03B 17/55 |
| | | | | 396/427 |
| 2013/0027950 | A1* | 1/2013 | Avedon | F24F 7/065 |
| | | | | 362/368 |
| 2016/0146222 | A1* | 5/2016 | Avedon | F04D 19/002 |
| | | | | 415/211.2 |
| 2017/0019571 | A1* | 1/2017 | McBride | H04N 5/2252 |
| 2017/0370363 | A1* | 12/2017 | Avedon | F04D 29/601 |
| 2018/0126825 | A1* | 5/2018 | Lee | B60H 1/3428 |
| 2019/0011121 | A1* | 1/2019 | Avedon | F21V 33/0096 |

FOREIGN PATENT DOCUMENTS

| | | |
|---|---|---|
| JP | 2009-135723 A | 6/2009 |
| JP | 3161388 U | 7/2010 |
| JP | 5054852 B2 | 10/2012 |
| KR | 10-1149262 B1 | 5/2012 |
| KR | 10-2015-0017986 A | 2/2015 |
| KR | 10-2015-0102845 A | 9/2015 |
| KR | 10-2015-0141060 A | 12/2015 |
| KR | 10-2016-0009749 A | 1/2016 |
| WO | 2012/020823 A1 | 2/2012 |

OTHER PUBLICATIONS

Written Opinion (PCT/ISA/237) dated Jul. 3, 2017 issued by the International Searching Authority in International Application No. PCT/KR2016/015477.

* cited by examiner

COOLING DEVICE FOR SURVEILLANCE CAMERA

CROSS-REFERENCE TO THE RELATED APPLICATION

This application is a continuation of International Application No. PCT/KR2016/015477, filed Dec. 29, 2016 which claims priority from Korean Patent Application No. 10-2016-0130828, filed on Oct. 10, 2016, in the Korean Intellectual Property Office, the disclosures of which are incorporated herein in their entirety by reference.

BACKGROUND

1. Field

Apparatuses consistent with exemplary embodiments relate to a cooling device for surveillance camera, and more particularly, to a cooling device for surveillance camera capable of effectively cooling a surveillance camera even in a high-temperature environment.

2. Description of the Related Art

When a surveillance camera is installed in an exterior of a building, the surveillance camera should be protected from the elements to maintain its performance without being affected by, for example, changes in the surrounding climate.

For example, in the Middle East region, surveillance cameras located outside the buildings are exposed to high-temperature environments due to the influences of solar heat, terrestrial heat, etc. When a surveillance camera needs to be used in an environment that exceeds a threshold temperature beyond the normal operating temperature, a cooling device for cooling the surveillance camera is installed in the surveillance camera.

U.S. Patent Application Publication Nos. 2007-0183772 and 2005-0213960 are directed to a cooling device technology in which a heat pump including a Peltier device is installed on an outer housing surrounding a surveillance camera. According to the technology using the Peltier device, the inside heat of the outer housing of the surveillance camera can be pumped to the exterior of the outer housing.

The Peltier device has disadvantages of high cost and low energy efficiency, and the Peltier device may not an ideal candidate to cool a surveillance camera in an extreme high-temperature environment such as the Middle East region. For example, in order to sufficiently cool a surveillance camera using the Peltier device, the size of the heat pump including the Peltier device should be large enough such that the size of the heat pump is nearly similar to that of the surveillance camera. Therefore, the total size and weight of the surveillance camera is greatly increased with the incorporation of the Peltier device. Also, because the Peltier device employs a method of transferring the inside heat of the surveillance camera to the exterior of the outer housing through only an area of the outer housing on which the Peltier device is installed to cool a narrow local area of the outer housing, the cooling performance of the Peltier device may be inadequate.

U.S. Patent Application Publication No. 2008-0024604 and Japanese Registration Patent No. 4257317 disclose a cooling device in which cooling fans are installed in the inside of an outer housing surrounding a surveillance camera. According to this type of cooling device, the surveillance camera may be cooled by discharging the inside heat of the outer housing of the surveillance camera to the outside or introducing outside air to the inside of the outer housing. However, because a plurality of cooling fans are required to surround the surveillance camera in order to sufficiently cool the heat generated from various components of the surveillance camera, the total volume of the surveillance camera increases, and the surveillance camera becomes inefficient.

Also, although the cooling device of the above-described structure cools the inside space of the outer housing by installing the cooling fans in the inside of the outer housing, the cooling device could not cool the outer housing sufficiently when the outer housing itself is heated due to the external heat from the exterior environment.

SUMMARY

One of more exemplary embodiments provide a cooling device for surveillance camera capable of efficiently cooling the surveillance camera even in a high-temperature environment.

One of more exemplary embodiments provide a cooling device for surveillance camera capable of directly cooling an outer surface of an outer housing with cooling air.

One of more exemplary embodiments provide a cooling device for surveillance camera capable of cooling a wide area of an outer housing surrounding a surveillance camera.

According to an aspect of an exemplary embodiment, there is provided a cooling device for surveillance system including: an outer housing surrounding a surveillance camera; and a blower positioned on an outer surface of the outer housing and configured to generate cooling air flowing along the outer surface of the outer housing.

The blower may include: a cooling fan configured to generate the cooling air; and a nozzle configured to discharge the cooling air in a direction following a contour of the outer surface of the outer housing.

The outer surface of the outer housing may be radially curved along a circumferential direction of the outer housing with respect to a central axis of the outer housing. The nozzle may be configured to discharge the cooling air in a direction being inclined with respect to the circumferential direction of the outer housing.

The blower may include a shroud surrounding the cooling fan and including an inlet for receiving outside air. A first end of the nozzle is connected to the shroud, and a second end opposite to the first end of the nozzle opens toward the outer surface of the outer housing.

A distance from an inner surface of the nozzle to the outer surface of the outer housing may be reduced gradually toward the second end of the nozzle from the first end of the nozzle.

The nozzle may include an outlet configured to discharge the cooling air at the second end. The outlet may extend in the circumferential direction of the outer housing along the outer surface of the outer housing.

The cooling device may further include a vane positioned between the first end of the nozzle and the second end of the nozzle in the nozzle, the vane being configured to guide a flow of the cooling air.

A vane may include a plurality of vanes, the plurality of vanes being inclined with respect to the circumferential direction of the outer housing.

The vane may include a heat conductive material and is in contact with the outer surface of the outer housing.

The vane may include a heat conductive material and is positioned in the outer housing. The cooling device may further include a heat transfer plate configured to transfer heat generated from the surveillance camera. The vane is connected to the heat transfer plate.

The outer housing may include a through hole at a location at which the vane is positioned. The vane may be connected to the heat transfer plate through the through hole.

The outer surface of the outer housing may be radially curved along a circumferential direction of the outer housing with respect to a central axis of the outer housing. The blower may include a shroud accommodating the cooling fan and including an inlet for receiving external air. The nozzle may be connected to the shroud, has a shape of a hollow tube, surrounds at least one area of the outer surface of the outer housing along the circumferential direction of the outer housing, and comprises an outlet for discharging the cooling air toward the outer surface of the outer housing.

A first end of the nozzle may be connected to the shroud, and the nozzle extends toward a second end opposite to the first end of the nozzle from the first end along the circumferential direction of the outer housing.

A cross-sectional area of the nozzle may be reduced from the first end to the second end.

When the nozzle extends along the circumferential direction of the outer housing, a central location of a cross section area of the nozzle may move along a direction that is parallel to the central axis of the outer housing.

The nozzle may surround the outer surface of the outer housing along the circumferential direction of the outer housing. The second end of the nozzle may overlap with the shroud on the outer surface of the outer housing.

The cooling device may further include a transition pipe connecting the first end of the nozzle to the shroud, the transition pipe extending with an inclination angle with respect to the central axis of the outer housing.

The cooling device may further include a protrusion extending along an extension direction of the nozzle and adjoining the outlet in the nozzle.

A cross-sectional area of the protrusion may change along the extension direction of the nozzle from the first end of the nozzle to the second end of the nozzle.

A width of the outlet may be reduced from the from end of the nozzle to the second end of the nozzle from along an extension direction of the nozzle.

According to the cooling device for surveillance camera related to the above-described exemplary embodiments, because cooling air generated by the blower flows along the outer surface of the outer housing, the outer housing surrounding the surveillance camera can be effectively cooled.

Because the cooling air cools the outer housing by directly contacting the outer surface of the outer housing, the outer housing can be sufficiently cooled even when the surveillance camera is used in a high-temperature environment such as the Middle East region where extreme external heat can be applied to the outer housing of the surveillance camera. Accordingly, the cooling device for surveillance camera of excellent cooling performance can be manufactured with low manufacturing cost without using a Peltier device having high cost and low energy efficiency.

Also, because the cooling air is discharged in a direction being inclined with respect to the circumferential direction of the outer housing, separation of the flow of the cooling air can be suppressed while the cooling air flows over a wide area along the outer surface of the outer housing to increase an effective cooling area, thereby obtaining an improved cooling effect.

Also, the flow of cooling air can be effectively guided by the vane positioned in the nozzle, and when the vane is made of a heat transfer material, the cooling performance of the outer housing can be further improved.

Also, because a nozzle surrounds the outer surface in circumferential direction of the outer housing to discharge cooling air, a sufficient cooling effect for a wide outer area of the outer housing can be obtained.

Also, by adopting a simple structure in which the blower is positioned on the outer surface of the outer housing surrounding the surveillance camera, the surveillance camera can be manufactured with a smaller size, and also the heat generated from various components of the surveillance camera can be sufficiently cooled.

BRIEF DESCRIPTION OF DRAWINGS

The above and/or other aspects and features of the present disclosure will become more apparent by describing in detail exemplary embodiments thereof with reference to the attached drawings, in which.

DETAILED DESCRIPTION

Figure 1:
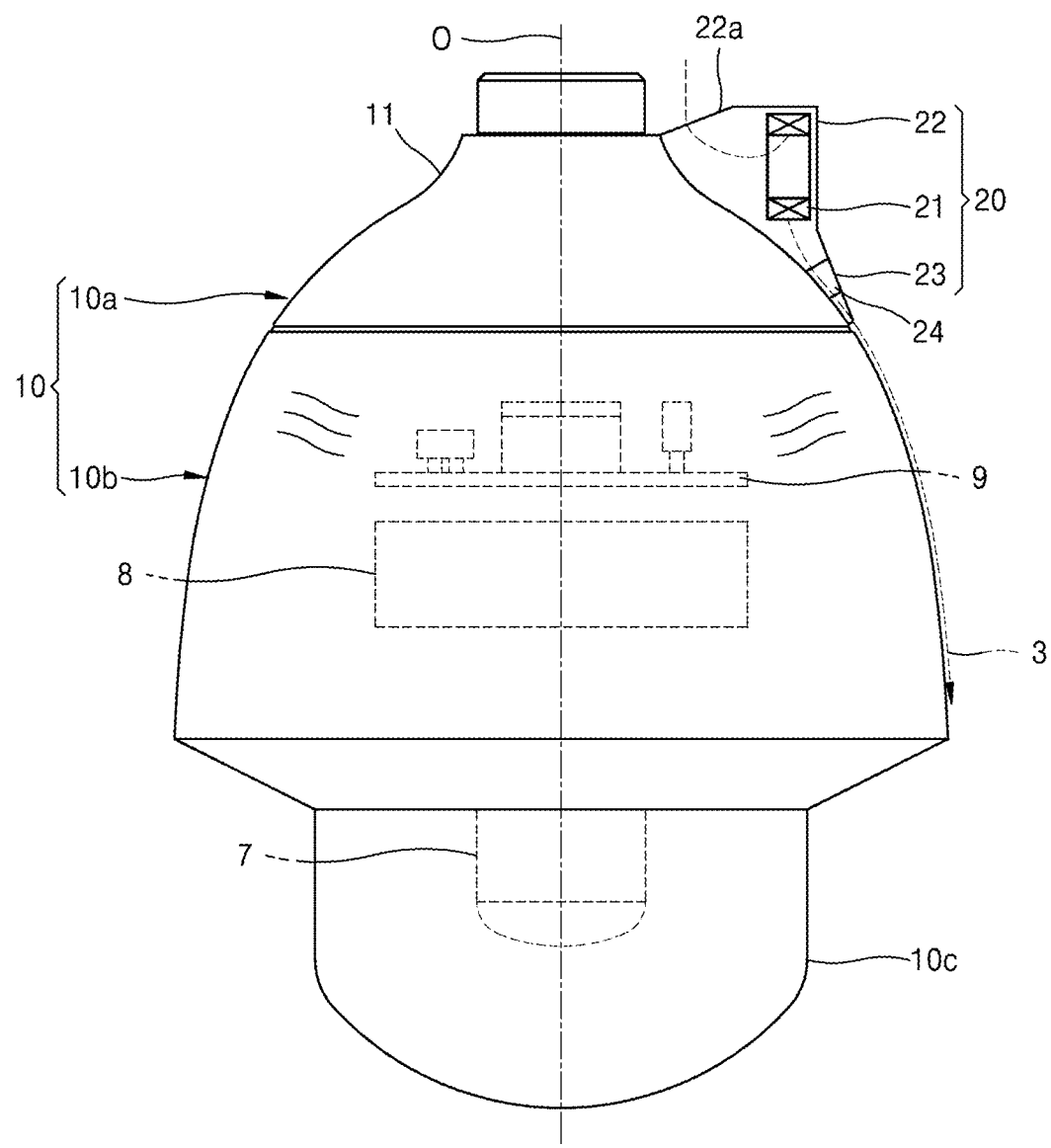
FIG. 1 is a front view of a cooling device for surveillance camera according to an exemplary embodiment.

Advantages and features of the inventive concept and methods of accomplishing the same may be understood more readily by reference to the following detailed description of preferred exemplary embodiments and the accompanying drawings. The inventive concept may, however, be embodied in many different forms and should not be construed as being restricted to the exemplary embodiments set forth herein. Rather, these exemplary embodiments are provided so that this disclosure will be thorough and complete and will fully convey the concept of the inventive concept to those skilled in the art, and the inventive concept will only be defined by the appended claims. Same reference numerals refer to same elements throughout the specification.

Unless otherwise defined, all terms (including technical and scientific terms) used in this specification may be used in the meaning that can be understood in common by those having ordinary skill in the technical field to which the inventive concept belongs. Also, the terms commonly used and predefined are not interpreted ideally or unduly unless expressly defined otherwise.

The terms used in the present specification are for the purpose of describing the examples and do not restrict the inventive concept. In the specification, the singular form also includes the plural forms unless specifically stated in a phrase. The terms "comprises" and/or "comprising" used in the specification do not exclude the presence or addition of one or more other constituent elements, in addition to the referenced constituent elements.

Hereinafter, a configuration and operations of a cooling device for surveillance camera according to exemplary embodiments will be described in detail with reference to the accompanying drawings.

Figure 2:
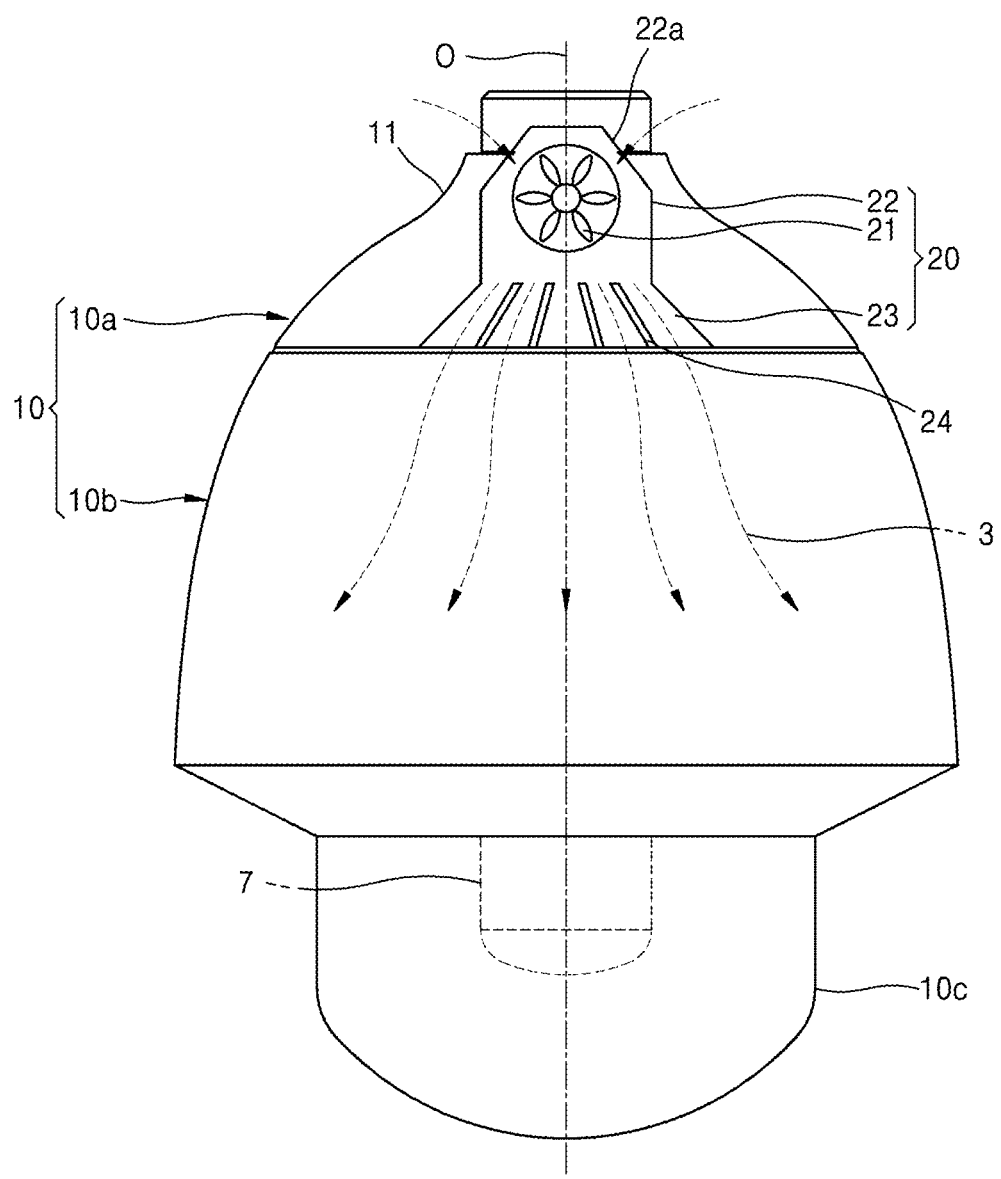
FIG. 2 is a side view of the cooling device for surveillance camera of FIG. 1.

FIG. 1 is a front view of a cooling device for surveillance camera according to an exemplary embodiment, and FIG. 2 is a side view of the cooling device for surveillance camera of FIG. 1.

The cooling device for surveillance camera according to the exemplary embodiment of the disclosure as shown in FIGS. 1 and 2 may include an outer housing 10 surrounding a surveillance camera 7, and a blower 20 positioned on an outer surface 11 of the outer housing 10 and configured to generate cooling air 3 flowing along the outer surface 11.

The surveillance camera 7 may operate according to a signal received from the exterior of the surveillance camera to rotate in a left-right (clockwise/counter-clockwise on a horizontal plane) direction and rotate in an up-down direction (clockwise/counter-clockwise on a vertical plane) to change a monitoring area, and perform a function of photographing images.

The surveillance camera 7 may include a lens assembly for receiving image light, an imaging device for converting the image light into an electrical signal, an image processor for processing signals generated by the imaging device to create image data, a driver for generating rotation motions of left-right and up-down directions to change a monitoring area, and a controller for supplying power, communicating with the outside, and controlling operations of the surveillance camera 7.

The outer housing 10 may include a case 10b surrounding various electronic components generating heat inside the outer housing 10, a head 10a configured to fix the case 10b on an installation surface, such as a wall or ceiling, and a dome cover 10c of a light transmission material coupled with one end of the case 10b to transmit light and configured to protect the surveillance camera 7 from the exterior.

The head 10a of the outer housing 10 may also function as a passage for a power cable for supplying electricity to the surveillance camera 7 and an electrical cable including signal lines for transmitting signals to the surveillance camera 7.

The case 10b of the outer housing 10 may surround electronic components, such as a power supply 8 for supplying power to the surveillance camera 7 and a control circuit board 9 for controlling the surveillance camera 7 and for processing photographed images, to accommodate and protect the electronic components. Also, the case 10b may dissipate heat generated from the electronic components to the exterior of the outer housing 10.

The blower 20 may include a cooling fan 21 rotating to generate cooling air 3, and a nozzle 23 for discharging the cooling air 3 generated by the cooling fan 21 toward a direction following the contour of the outer surface 11 of the outer housing 10. That is, the cooling air 3 is discharged to follow the extending direction of the outer surface 11 of the outer housing 10.

The outer surface 11 of the outer housing 10 may be curved along a circumferential direction with respect to a central axis O of the outer housing 10. The central axis O of the outer housing 10 may be a geometrical center of the outer housing 10, and pass the surveillance camera 7 accommodated in the outer housing 10. The cross section shape of the outer housing 10 may be symmetrical with respect to the central axis O.

The nozzle 23 may discharge cooling air 3 such that the cooling air 3 flows along the outer surface 11 of the outer housing 10 thereby cooling the outer surface 11.

The blower 20 may also include a shroud 22 surrounding the cooling fan 21 and the shroud 22 includes an inlet 22a for receiving outside air. One end of the nozzle 23 may be connected to the shroud 22 and the other end of the nozzle 23 may open toward the outer surface 11 of the outer housing 10.

A (radial) distance between an inner surface of the nozzle 23 and the outer surface 11 of the outer housing 10 may be reduced gradually toward the open end of the nozzle 23 opened toward the outer surface 11 from the one end of the nozzle 23 connected to the shroud 22. That is, a height of the nozzle 23 may be reduced gradually toward the open end of the nozzle 23.

In the inside of the nozzle 23, a vane 24 for guiding a flow of cooling air 3 passing through the nozzle 23 may be provided. The vane 24 may be made up of a heat conductive material capable of conducting heat and be in contact with the outer surface 11 of the outer housing 10 to cool the outer surface 11.

Specifically, the vane 24 may be made of a metal material, such as, for example, aluminum, copper, stainless steel, etc., capable of effectively conducting heat. The vane 24 may be in direct contact with the outer surface 11 of the outer housing 10 to cool the outer surface 11 of the outer housing 10 together with the cooling air 3 passing through the nozzle 23. That is, the heat transferred to the outer housing 10 from, for example, various electronic components may raise a surface temperature of the vane 24, and cooling air 3 passing through the nozzle 23 may contact a surface of the vane 24 to thereby cool the vane 24.

Figure 3:
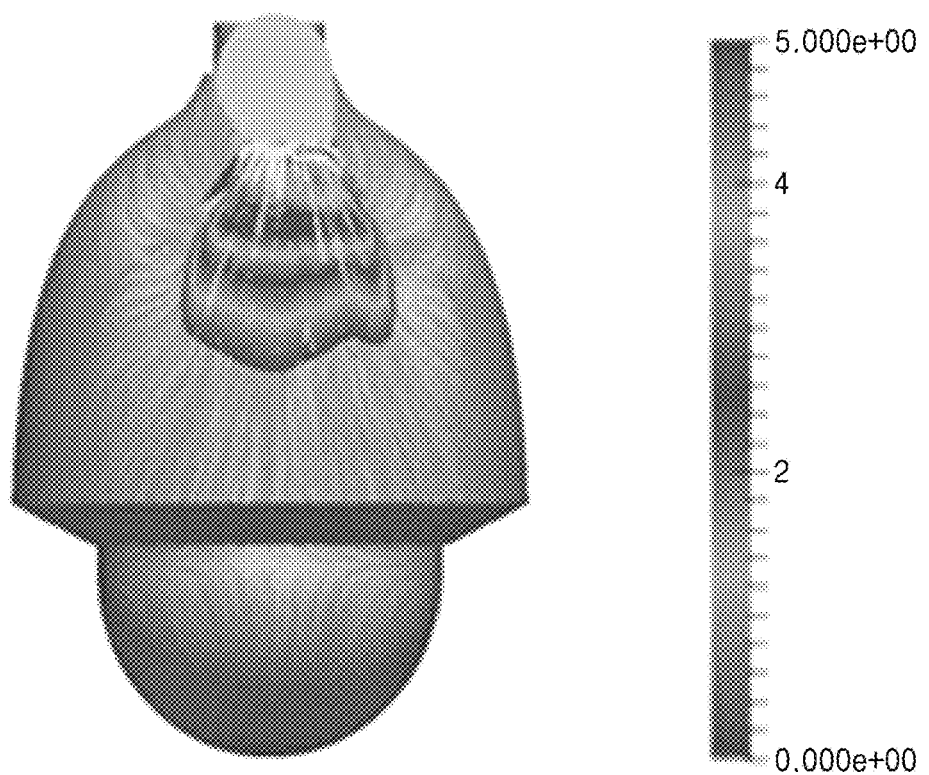
FIG. 3 shows a heat distribution on an outer housing of a cooling device for surveillance camera when the cooling device for surveillance camera of FIG. 2 operates.

FIG. 3 shows a heat distribution on an outer housing of a cooling device for surveillance camera when the cooling device for surveillance camera of FIG. 2 operates.

As shown in FIG. 2, cooling air 3 discharged from the nozzle 23 may flow along the outer surface 11 of the outer housing 10 to cool the outer surface 11 of the outer housing 10. Referring to FIG. 3, it is confirmed that due to a cooling effect of the cooling air 3, the areas of the outer surface 11 of the outer housing 10 on which the blower 20 is installed are intensively cooled.

In the cooling device for surveillance camera according to the exemplary embodiment shown in FIGS. 1 to 3, the blower 20 may be installed on the outer surface 11 of the outer housing 10 at a location corresponding to a location in which electronic components generating the most heat in the inside of the outer housing 10 are installed, thereby implementing an effective cooling performance of the surveillance camera 7 and the outer housing 10.

FIGS. 1 to 3 show a case in which a single blower 20 is installed on the outer housing 10, however, the number of the blower 20 is not limited thereto. For example, a plurality of blowers 20 may be installed along the circumferential direction of the outer surface 11 of the outer housing 10 to implement an even more effective cooling performance of the surveillance camera 7 and the outer housing 10.

Figure 4:
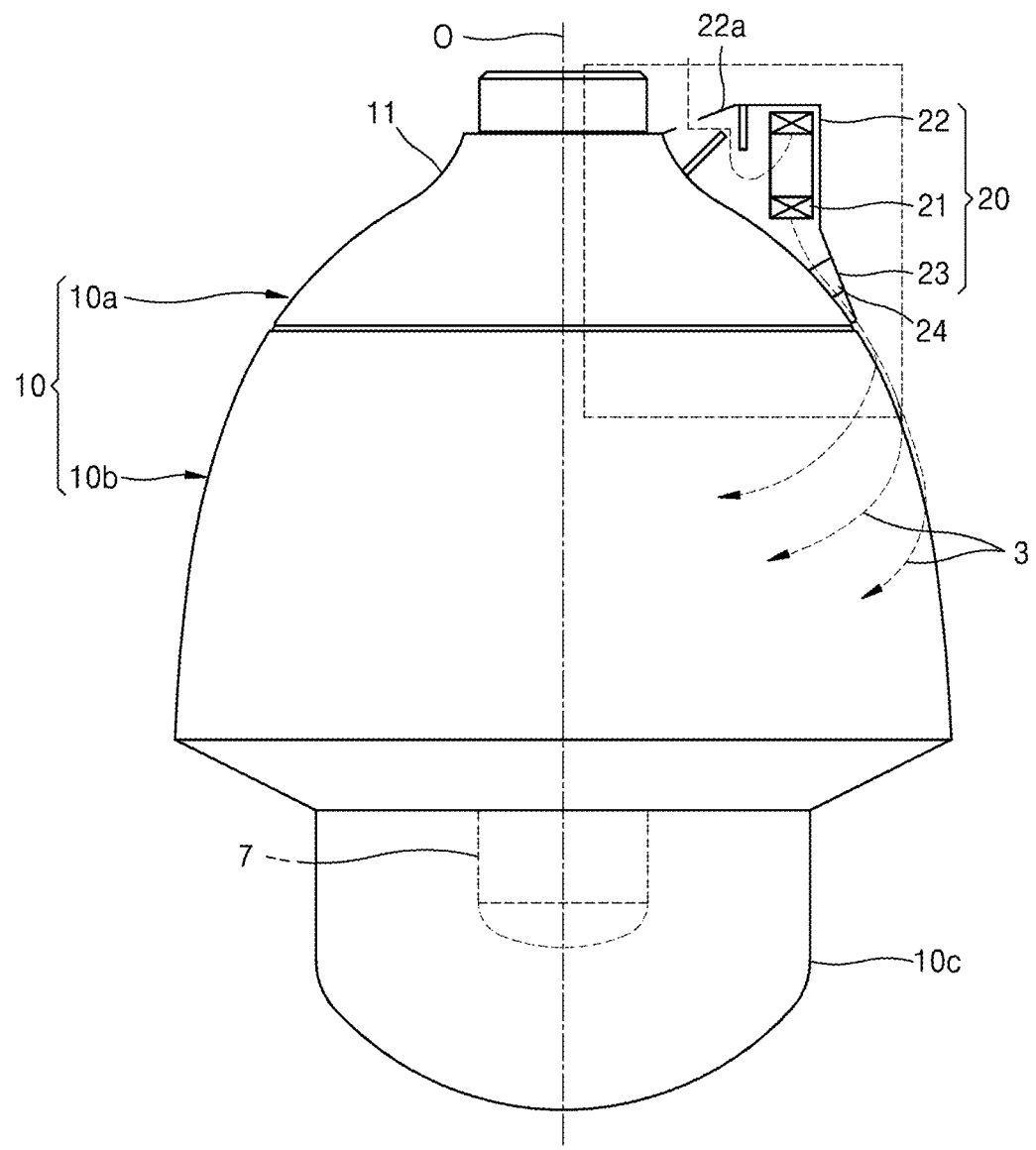
FIG. 4 is a front view of a cooling device for surveillance camera according to another exemplary embodiment.
Figure 5:
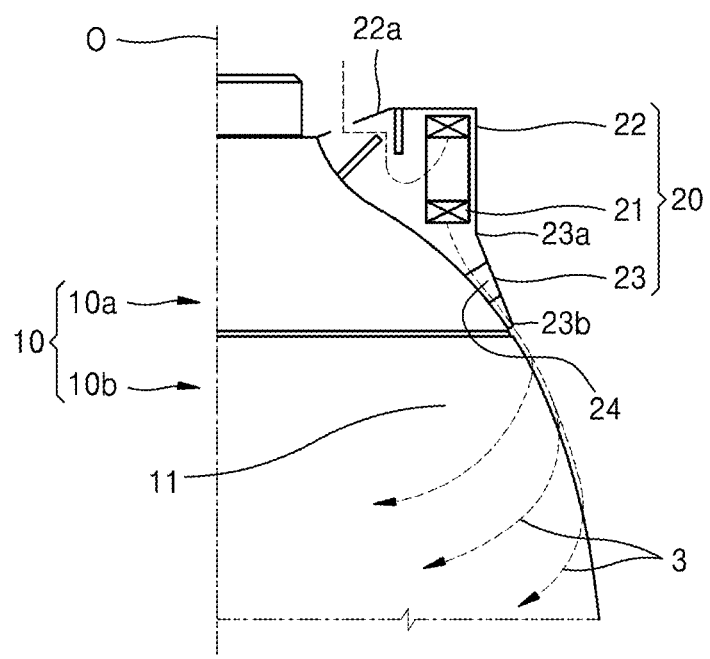
FIG. 5 is an enlarged view of a part of the cooling device for surveillance camera of FIG. 4.
Figure 6:
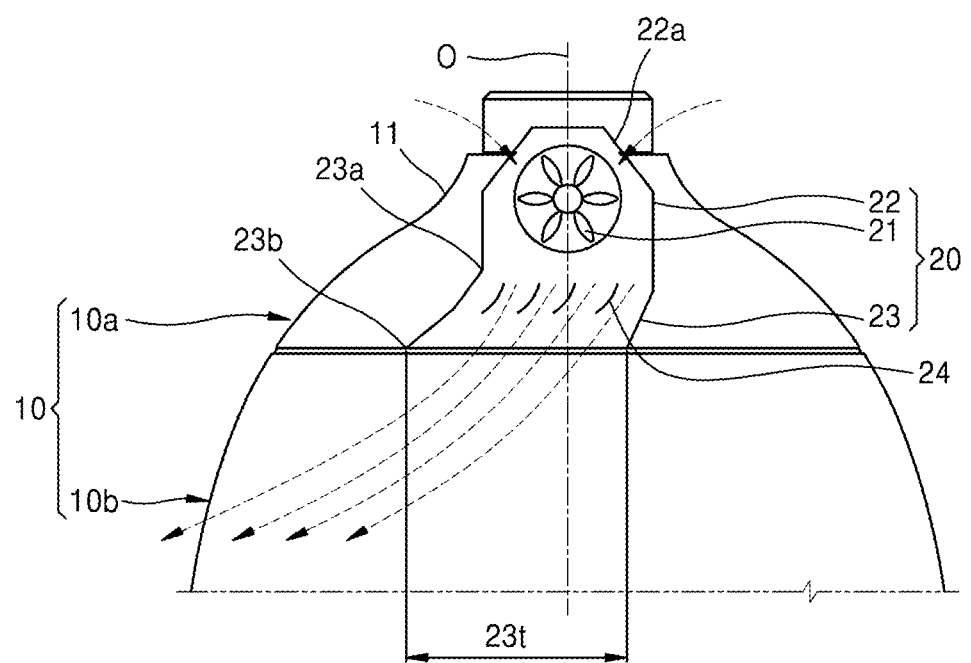
FIG. 6 is an enlarged side view showing a side of a part of the cooling device for surveillance camera of FIG. 4.
Figure 7:
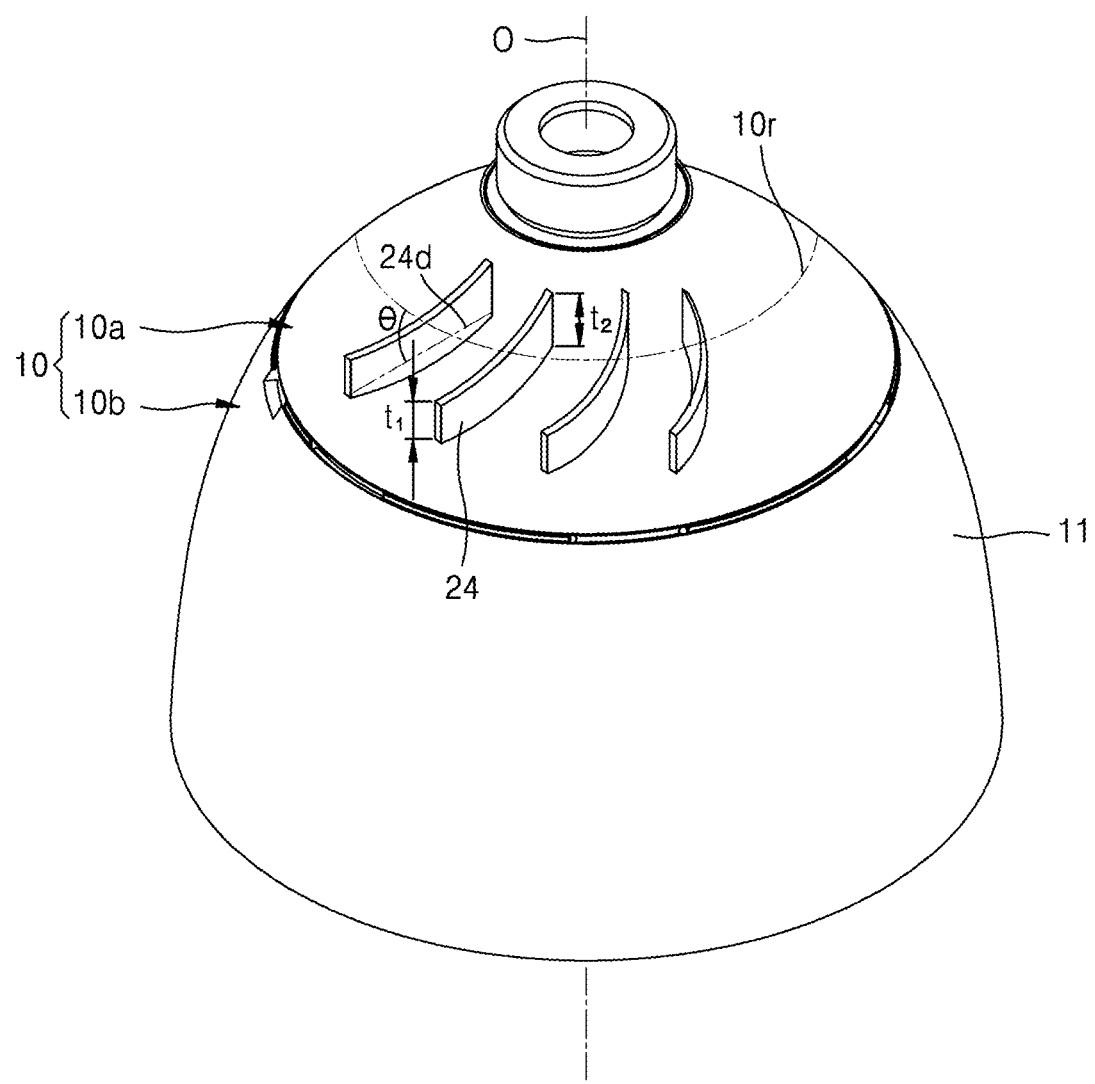
FIG. 7 is an enlarged perspective view of particular components of the cooling device for surveillance camera of FIG. 4.

FIG. 4 is a front view of a cooling device for surveillance camera according to another exemplary embodiment, FIG. 5 is an enlarged view of a part corresponding to a quadrangle of dotted lines in the cooling device for surveillance camera of FIG. 4, FIG. 6 is an enlarged side view showing a side of a part of the cooling device for surveillance camera of FIG. 4, and FIG. 7 is an enlarged perspective view of particular components of the cooling device for surveillance camera of FIG. 4.

The cooling device for surveillance camera according to the exemplary embodiment shown in FIGS. 4 to 7 may include an outer housing 10 surrounding a surveillance camera 7, and a blower 20 positioned on an outer surface 11 of the outer housing 10 and configured to generate cooling air 3 being discharged and flowing along the outer surface 11.

In general, a transfer amount of heat by a heat transfer effect according to a forced convection method is proportional to a temperature difference, a cooling area, and a flow velocity of cooling air. Accordingly, by causing the cool air to pass through a wide area at a high velocity in direct contact with the wide area, a cooling effect may be improved.

Meanwhile, according to a heat transfer effect based on a natural convection method, a flow of cooling air is formed due to a difference in buoyancy of air caused by a difference in temperature of air. However, a flow velocity U of the cooling air is about 0.1 m/s, and a heat transfer coefficient h is 3 to 4 W/m²K. Therefore, the cooling effect is low.

In the cooling device for surveillance camera according to the exemplary embodiments of the disclosure shown in FIGS. 1 to 7, a flow velocity of cooling air 3 generated by the cooling fan 21 may increase to 1 to 3 m/s (from about 0.1 m/s), and the heat transfer coefficient h may also markedly increase to 15 to 30 W/m²K (from 3 to 4 W/m²K).

Therefore, to maximize a cooling effect using the cooling fan 21, it may be desirable to maintain the flow velocity of the cooling air 3 flowing along the outer surface 11 of the outer housing 10 at a certain velocity, and to increase a cooling area of the outer surface 11 which the cooling air 3 contacts.

Generally, when cooling air 3 flows along the outer surface 11 of the outer housing 10, a separated flow (the flow being separated from the outer surface 11) in which a flow is dispersed by turbulence may occur. Such separated flow may need to be suppressed to improve the cooling effect of the cooling air 3.

The cooling device for surveillance camera according to the exemplary embodiment shown in FIGS. 4 to 7 may implement a Coanda effect when cooling air 3 is supplied to the outer surface 11 of the outer housing 10 to suppress the separated flow, thereby improving the cooling effect. The Coanda effect is a fluid flow characteristic in which a fluid tends to stay attached to the curved surface of an object and flow along the curved surface of the object.

The outer housing 10 may include a case 10b surrounding various electronic components generating heat, a head 10a fixing the case 10b on an installation surface, such as a wall or ceiling, and a dome cover 10c of a light transmission material coupled with one end of the case 10b to transmit light and configured to protect the surveillance camera 7. The case 10b and the head 10a may be made up of a heat conductive material capable of transmitting heat in at least one portion.

The head 10a of the outer housing 10 may also function as a passage for a power cable for supplying electricity to the surveillance camera 7 and an electrical cable including signal lines for transmitting signals to the surveillance camera 7.

The case 10b of the outer housing 10 may surround electronic components (which generate heat), such as a power supply 8 for supplying power to the surveillance camera 7 and a control circuit board 9 for controlling the surveillance camera and processing photographed images, to accommodate and protect the electronic components. Also, the case 10b may dissipate heat generated from the electronic components to the exterior of the outer housing 10.

The blower 20 may include a cooling fan 21 rotating to generate cooling air 3, and a nozzle 23 for discharging the cooling air 3 generated by the cooling fan 21 toward a direction following the contour of the outer surface 11 of the outer housing 10. That is, the cooling air 3 is discharged to follow the extending direction of the outer surface 11 of the outer housing 10.

The outer surface 11 of the outer housing 10 may be curved radially along a circumferential direction with respect to a central axis O of the external housing 10. The nozzle 23 may discharge cooling air 3 such that the cooling air 3 flows along the outer surface 11 of the outer housing 10.

The blower 20 may also include the shroud 22 surrounding the cooling fan 21 and the shroud 22 includes an inlet 22a for receiving outside air. One end 23a of the nozzle 23 may be connected to the shroud 22 and the other end 23b of the nozzle 23 may include an outlet opening toward the outer surface 11 of the outer housing 10.

Referring to FIG. 6, a width 23t of the outlet formed in the other end 23b of the nozzle 23 may extend in the circumferential direction along the outer surface 11 of the outer housing 10. A width in left-right direction of the nozzle 23 may be widened gradually toward the other end 23b of the nozzle 23 from the one end 23a of the nozzle 23.

Referring back to FIG. 4, a (radial) distance from the inner surface of the nozzle 23 to the outer surface 11 of the outer housing 10 may be reduced gradually toward the open end 23b of the nozzle 23 opened toward the outer surface 11 from the one end 23a of the nozzle 23 connected to the shroud 22. That is, a width in thickness direction (i.e., the height) of the nozzle 23 may be reduced gradually toward the open end 23b of the nozzle 23 from the one end 23a of the nozzle 23.

The nozzle 23 of the above-described structure may discharge cooling air 3 in a direction being inclined with respect to the circumferential direction of the outer housing 10 along the outer surface 11 of the outer housing 10. Therefore, the cooling air 3 may flow over the wide area of the outer surface 11 of the outer housing 10 to implement a sufficient cooling effect.

In the inside of the nozzle 23, a vane 24 for guiding a flow of cooling air 3 passing through the nozzle 23 may be installed between the one end 23a of the nozzle 23 and the other end 23b of the nozzle 23. The vane 24 may be made up of a heat conductive material capable of conducting heat and be in contact with the outer surface 11 of the outer housing 10.

Referring to FIG. 7, a plurality of vanes 24 may be arranged to be directed along virtual line 23d forming an inclination angle of θ with respect to a circumferential direction 10r of the outer housing 10 on the outer surface 11 of the outer housing 10. The vanes 24 may be spaced apart from one another in the circumferential direction 10r of the outer housing 10. In addition, each of the vanes 24 may be curved in the shape of an arc with an inclination angle with respect to the circumferential direction 10r of the outer housing 10.

Heights t2 of one ends of the vanes 24 may be greater than heights t1 of the other ends of the vanes 24, and the heights of the vanes 24 may be reduced gradually toward the other ends of the vanes 24 from the one ends of the vanes 24 to correspond to a change in the height of the nozzle 23 as described above.

The vanes 24 may be made of a conductive material, such as, for example, aluminum, copper, stainless steel, etc., capable of conducting heat. The vanes 24 may be in direct contact with the outer surface 11 of the outer housing 10 to cool the outer surface 11 of the outer housing 10 together with the cooling air 3 passing through the nozzle 23. That is, heat transferred to the outer housing 10 from the various electronic components (or from the external elements, e.g. high external temperature) may raise a surface temperature of the vanes 24, and cooling air 3 passing through the nozzle 23 may contact surfaces of the vanes 24 to cool the vanes 24.

Figure 8:
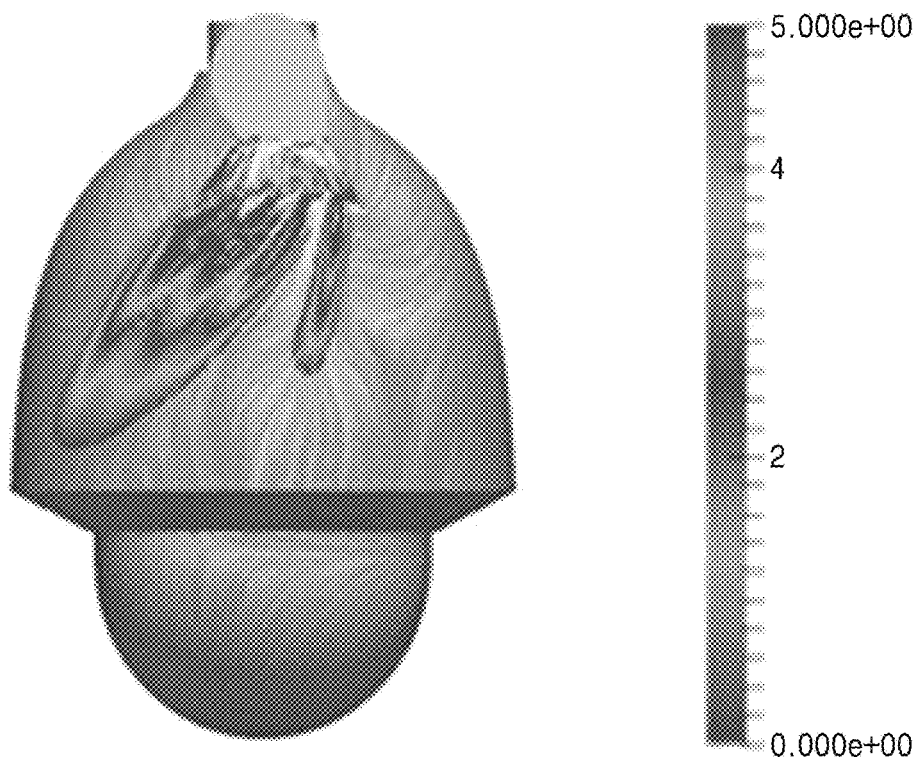
FIG. 8 shows a heat distribution on an outer housing of a cooling device for surveillance camera when the cooling device for surveillance camera of FIG. 4 operates.

FIG. 8 shows a heat distribution on an outer housing of a cooling device for surveillance camera when the cooling device for surveillance camera of FIG. 4 operates.

As shown in FIGS. 4 to 7, because cooling air 3 discharged from the nozzle 23 flows in a direction being inclined with respect to the circumferential direction of the outer housing 10 along the outer surface 11 of the outer housing 10, a wide area of the outer surface 11 of the outer housing 10 may be stably cooled.

Referring to FIG. 8, it is confirmed that an area in which cooling is performed on the outer surface 11 of the outer housing 10 is widened in a direction in which cooling air 3 flows from a location at which the blower 20 is installed on the outer surface 11 of the outer housing 10.

Referring back to FIG. 3, when cooling air 3 flows perpendicularly downward from the blower 2, a separated flow may occur. Therefore, in this case, an effective cooling area in which cooling is substantially performed may be limited.

Comparing a result shown in FIG. 8 with a result shown in FIG. 3, because cooling air having an inclination to the circumferential direction of the outer housing 10 is supplied, as shown from the result of FIG. 8, the flow separation of cooling air may be suppressed by the Coanda effect. Therefore, the cooling air may move over a wide area along the outer surface 11 of the outer housing 10, and an effective cooling area in which cooling is substantially performed may be widened.

In the cooling device for surveillance camera according to the exemplary embodiment in FIGS. 4 to 7, the blower 20 may be installed at a location of the outer surface 11 of the outer housing 10 corresponding to a location in which electronic components generating the most heat in the inside of the outer housing 10 are installed, thereby implementing an effective cooling performance of the surveillance camera 7 and the outer housing 10.

FIGS. 4 to 7 show a case in which a single blower 20 is installed in the outer housing 10, however, the number of the blower 20 is not limited thereto. For example, a plurality of blowers 20 may be installed along the circumferential direction of the outer surface 11 of the outer housing 10 to implement an even more effective cooling performance of the surveillance camera 7 and the outer housing 10.

Figure 9:
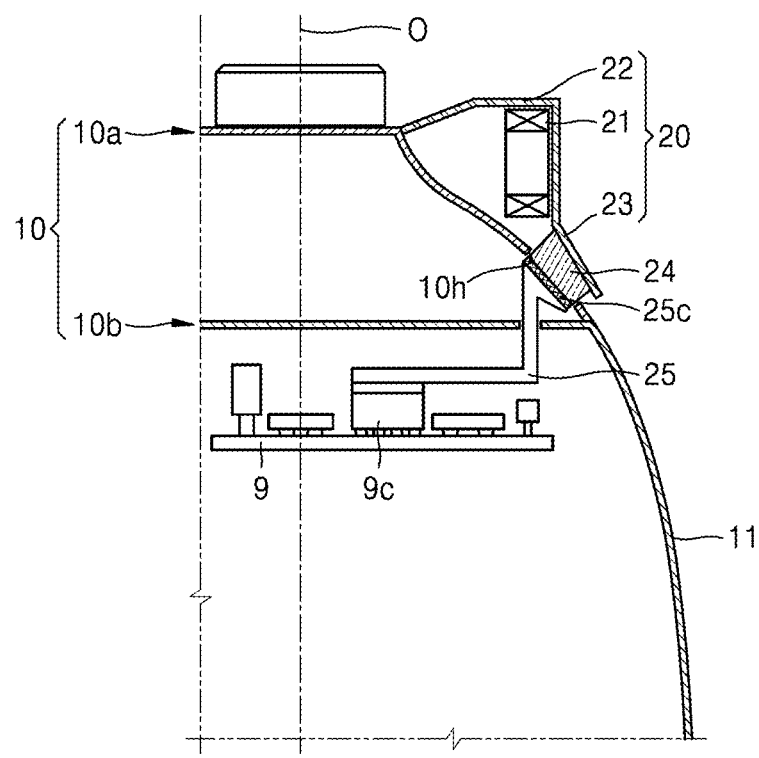
FIG. 9 is a cross-sectional view schematically showing a connection relationship between particular components of the cooling device for surveillance camera of FIG. 4.

FIG. 9 is a cross-sectional view schematically showing a connection relationship between particular components of the cooling device for surveillance camera of FIG. 4.

In FIG. 9, a structure in which various electronic components positioned in the inside of the case 10b of the outer housing 10 are connected to the vanes 24 of the blower 20 is schematically shown. On a control circuit board 9 installed in the inside of the case 10b of the outer housing 10, a semiconductor chip 9c generating heat may be mounted, and the semiconductor chip 9c may be connected to a heat transfer plate 25 by a thermal grease or a thermal pad. The heat transfer plate 25 may have a structure formed by modifying a heat sink that is used as a component of a computer or an electronic product. The heat transfer plate 25 may be made of a heat conductive metal, such as copper or aluminum.

An upper end of the heat transfer plate 25 may penetrate the case 10b and protrude toward the head 10a. The head 10a of the outer housing 10 may include a through hole 10h at a location at which each vane 24 is positioned. One end of the vane 24 toward the outer surface 11 of the outer housing 10 may be connected to the heat transfer plate 25 through the through hole 10h. A thermal grease 25c may be applied as a heat transfer material between the vane 24 and the heat transfer plate 25.

By the connection structure of the heat transfer plate 25 and the vane 24, the heat generated from the electronic components installed in the inside of the outer housing 10 may be transferred to the heat transfer plate 25 and the vane 24, sequentially, and discharged to the outside of the outer housing 10.

In FIG. 9, the vane 24 may be inserted in the through hole 10h of the outer housing 10 to be connected to the heat transfer plate 25. However, the exemplary embodiment is not limited to the installation structure of the vane 24. As a modification, for example, an end of the heat transfer plate 25 may protrude from the through hole 10h of the outer housing 10, and the vane 24 may be connected to the protruding end of the heat transfer plate 25.

Figure 10:
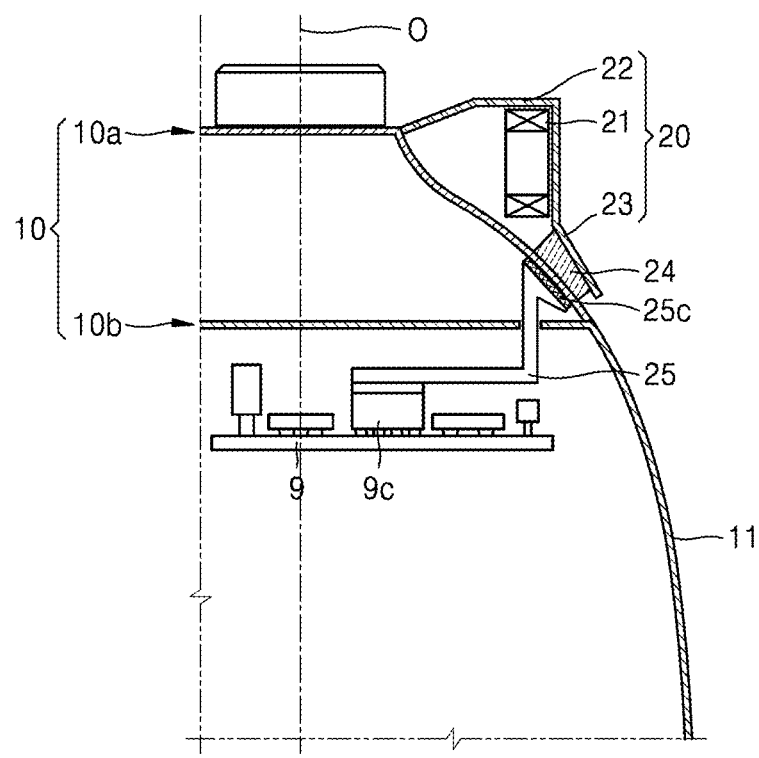
FIG. 10 is a cross-sectional view schematically showing a connection relationship between some components of a cooling device for surveillance camera according to another exemplary embodiment.

FIG. 10 is a cross-sectional view schematically showing a connection relationship between particular components of a cooling device for surveillance camera according to another exemplary embodiment. In FIG. 10, a structure, in which electronic components installed in the inside of the case 10b of the outer housing 10 are connected to the vane 24 of the blower 20, is schematically shown.

The cooling device for surveillance camera according to the exemplary embodiment of the disclosure shown in FIG. 10 may include an outer housing 10 surrounding a surveillance camera, and a blower 20 positioned on the outer surface 11 of the outer housing 10 and configured to generate cooling air flowing along the outer surface 11.

Comparing the exemplary embodiment of FIG. 10 with the exemplary embodiment of FIG. 9, the vane 24 of the blower 20 may be in contact with the outer surface 11 of the outer housing 10 in FIG. 10. The head 10a of the outer housing 10 contacting the vane 24 may be made of a heat-conductive metal material, such as aluminum, copper, stainless steel, etc.

On a control circuit board 9 installed in the inside of the case 10b of the outer housing 10, a semiconductor chip 9c generating heat may be mounted, and the semiconductor chip 9c may be connected to a heat transfer plate 25 by a thermal grease or a thermal pad. The heat transfer plate 25 may have a structure formed by modifying a heat sink that is used as a component of a computer or an electronic product. The heat transfer plate 25 may be made of a heat conductive metal, such as copper or aluminum.

An upper end of the heat transfer plate 25 may penetrate the case 10b and be connected to an inner wall of the head 10a. A thermal grease 25c may be positioned as a heat transfer material between the vane 24 and the inner wall of the head 10a. However, a thermal pad, instead of the thermal grease 25c, may be incorporated for a thermal contact between the vane 24 and the inner wall of the head 10a.

By the connection structure of the heat transfer plate 25 and the vane 24 as described above, the heat generated from a surveillance camera (or other electronic components) installed in the inside of the outer housing 10 may be transferred to the heat transfer plate 25, the head 10a, and the vane 24, sequentially, and discharged to the outside of the outer housing 10.

Figure 11:
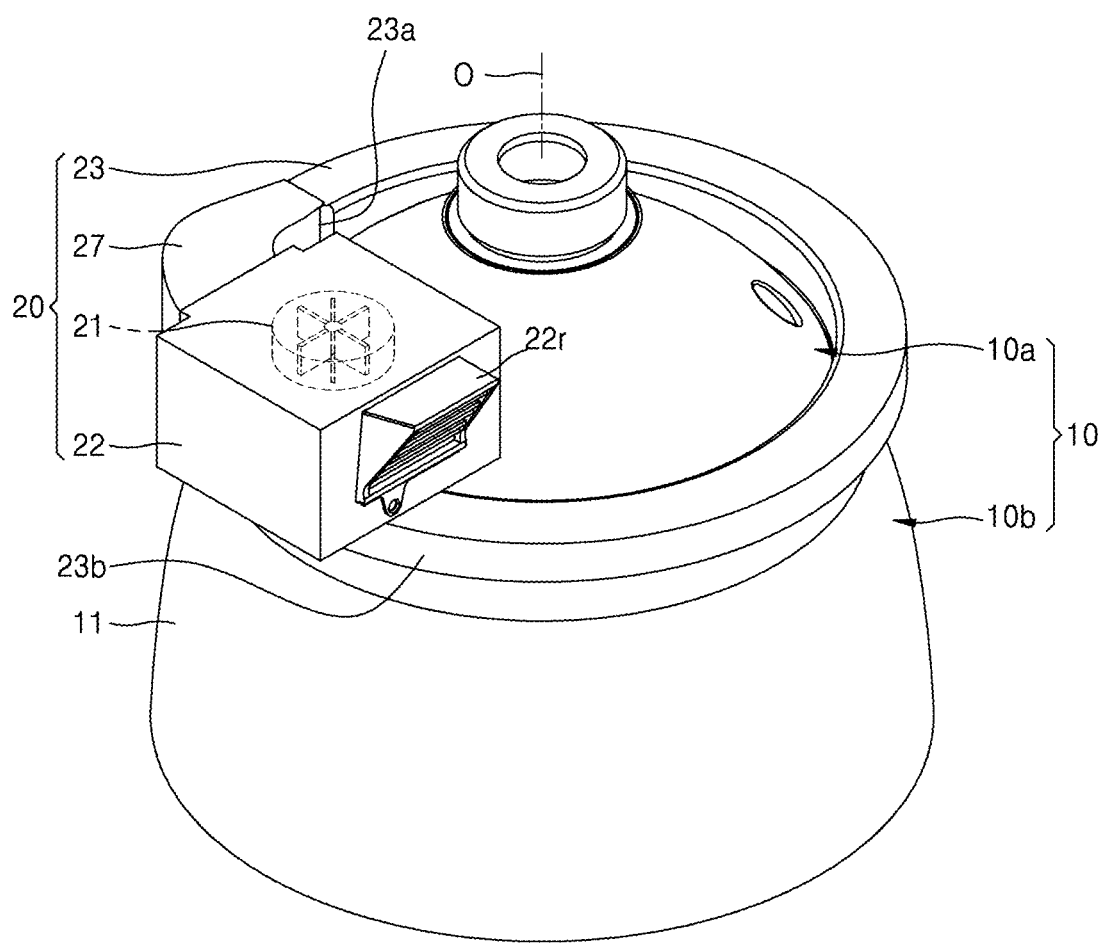
FIG. 11 is a perspective view of a cooling device for surveillance camera according to another exemplary embodiment.
Figure 12:
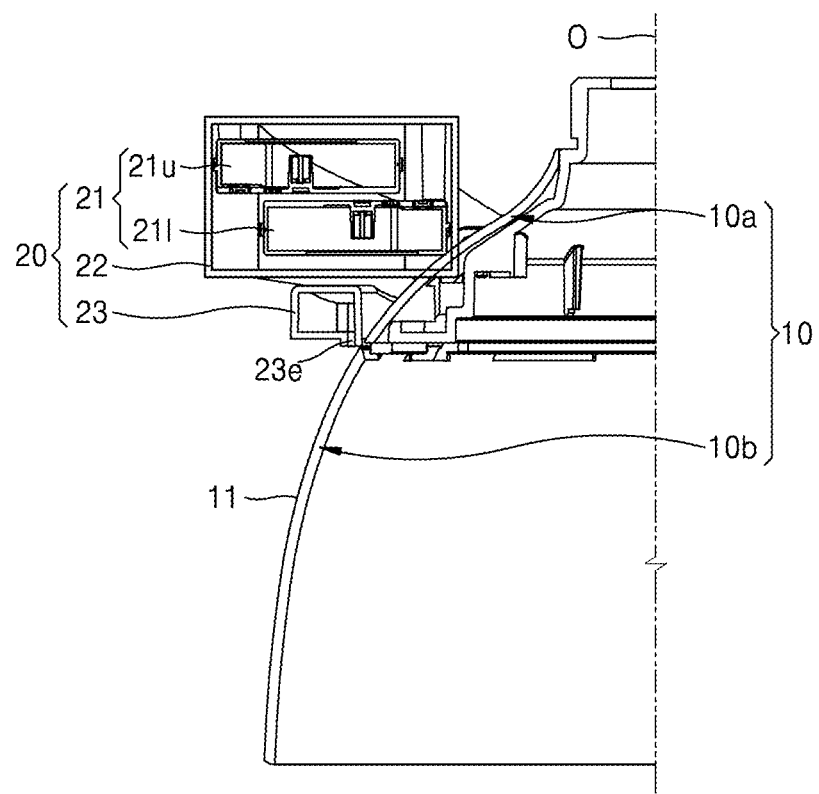
FIG. 12 is a cross-sectional view showing a part of the cooling device for surveillance camera of FIG. 11.

FIG. 11 is a perspective view of a cooling device for surveillance camera according to another exemplary embodiment, and FIG. 12 is a cross-sectional view showing a part of the cooling device for surveillance camera of FIG. 11.

The cooling device for surveillance camera according to the exemplary embodiment of the disclosure as shown in FIGS. 11 and 12 may include an outer housing 10 surrounding a surveillance camera 7, and a blower 20 positioned on an outer surface 11 of the outer housing 10 and configured to generate cooling air flowing along the outer surface 11.

The outer housing 10 may include a case 10b surrounding components generating heat, a head 10a fixing the case 10b on an installation surface, such as a wall or ceiling, and a dome cover of a light transmission material coupled with one end of the case 10b to transmit light and configured to protect the surveillance camera 7. Although the dome cover is not shown in FIGS. 11 and 12, a dome cover of the same configuration as the dome cover of the exemplary embodiment shown in FIG. 1 may be applied to the exemplary embodiment shown in FIGS. 11 and 12.

The blower 20 may include a cooling fan 21 rotating to generate cooling air 3, and a nozzle 23 for discharging the cooling air generated by the cooling fan 21 toward a direction to flow along the contour of an outer surface 11 of the outer housing 10. That is, the cooling air 3 is discharged to follow the extending direction of the outer surface 11 of the outer housing 10.

Referring to FIG. 12, the cooling fan 21 may be configured by overlapping an upper fan 21u with a lower fan 21l, and accordingly, dual wind generated by the cooling fan 21 may be supplied to the nozzle 23.

The outer surface 11 of the outer housing 10 may be curved radially along the circumferential direction with respect to the central axis of the outer housing 10. The nozzle 23 may discharge cooling air along the outer surface 11 of the outer housing 10.

The blower 20 may include a shroud 22 surrounding the cooling fan 21 and the shroud 22 may include a ventilation grill 22r forming an inlet for receiving the external air. The ventilation grill 22r may function to prevent, when outside air enters the shroud 22, foreign materials such as dust or sand included in the outside air from entering the shroud 22.

The nozzle 23 may be connected to the shroud 22 and may be in the shape of a hollow tube. The nozzle 23 may surround at least one area of the outer surface 11 of the outer housing 10 along the circumferential direction of the outer housing 10. The nozzle 23 may include an outlet 23e for discharging cooling air toward the outer surface 11 of the outer housing 10.

One end 23a of the nozzle 23 may be connected to the shroud 22 by a transition pipe 27. The nozzle 23 may extend along the circumferential direction of the outer housing 10 from the one end 23a of the nozzle 23 to the other end 23b.

The transition pipe 27 may extend with an inclination with respect to the central axis of the outer housing 10 to connect the one end 23a of the nozzle 23 to the shroud 22 positioned at another location on the outer surface 11 of the outer housing 10.

Referring to FIG. 12, the blower 20 including the shroud 22, the cooling fan 21, and the nozzle 23 may be positioned on the head 10a of the outer housing 10, and the outlet 23e of the nozzle 23 may open toward the case 10b coupled with a lower portion of the head 10a.

The nozzle 23 may surround the entire circumference of the outer surface 11 of the outer housing 10, and the other end 23b of the nozzle 23 on the outer surface 11 may overlap with the shroud 22.

According to the structure of the nozzle 23, cooling air discharged from the outlet 23e of the nozzle 23 may be dispersed equally over the entire area of the outer surface 11 of the outer housing 10.

Figure 13:
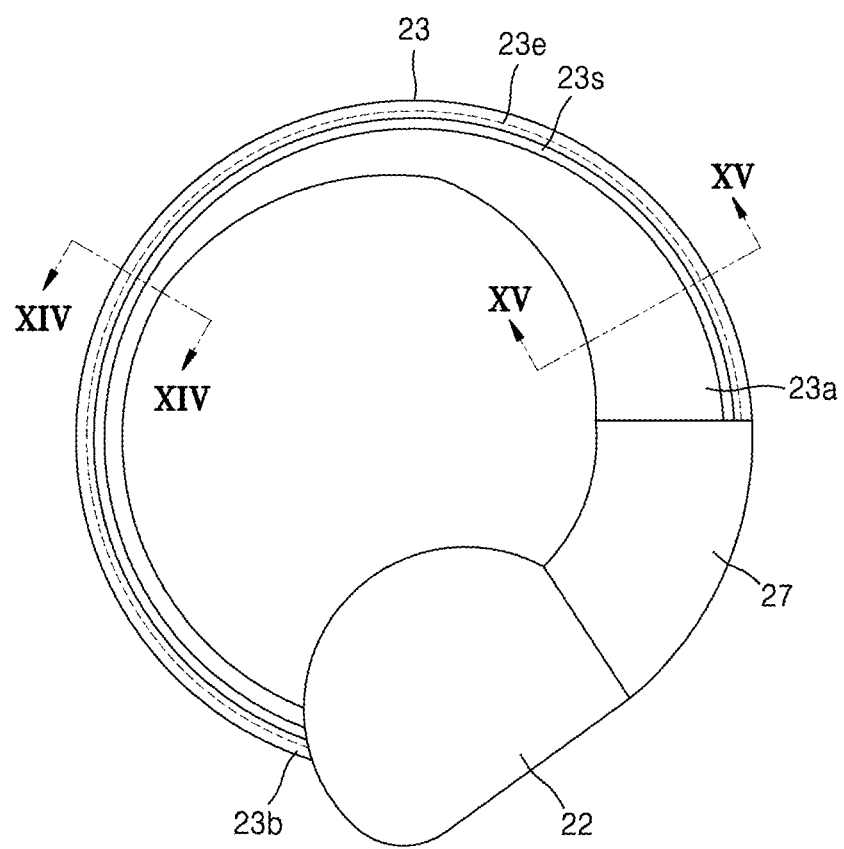
FIG. 13 is a top view of a cooling device for surveillance camera according to another exemplary embodiment.
Figure 14:
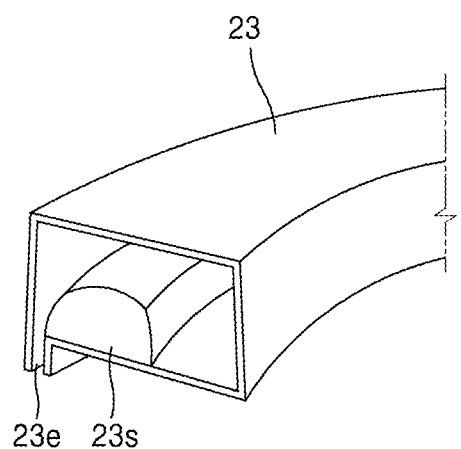
FIG. 14 is a perspective view showing a part of the cooling device for surveillance camera of FIG. 13, including a section of the cooling device for surveillance camera taken along line XIV-XIV.
Figure 15:
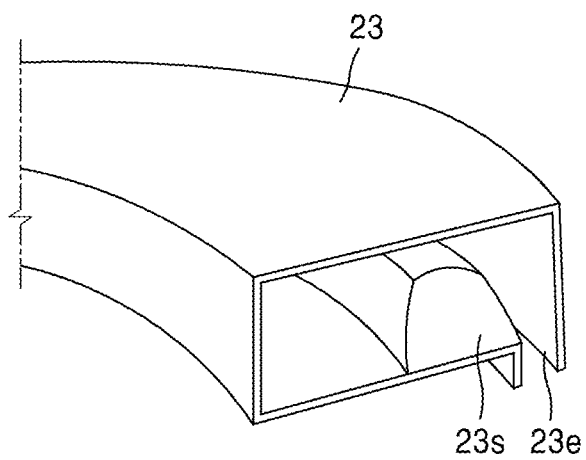
FIG. 15 is a perspective view showing another part of the cooling device for surveillance camera of FIG. 13, including a section of the cooling device for surveillance camera taken along line XV-XV.
Figure 16:
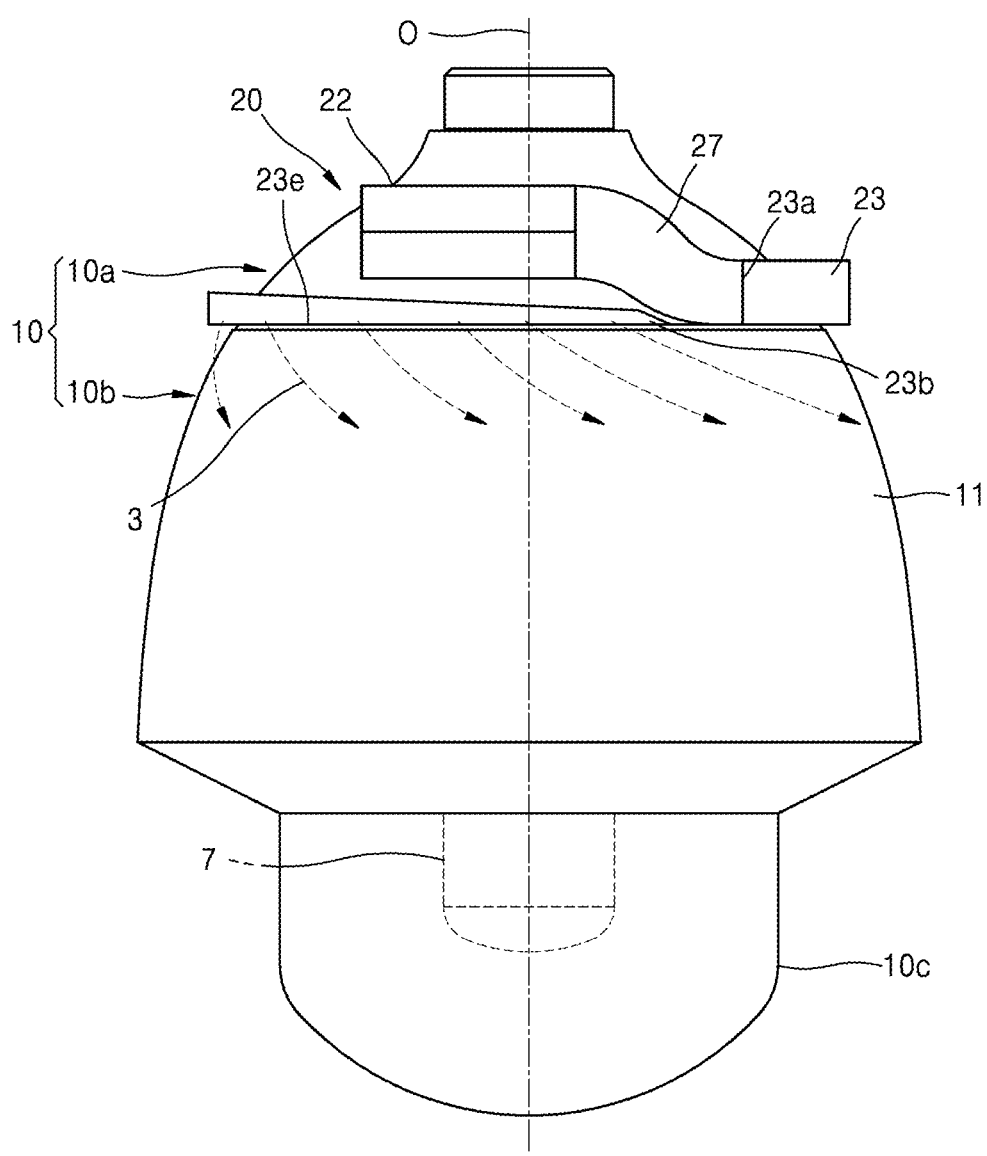
FIG. 16 is a front view of a surveillance camera in which the cooling device for the surveillance camera of FIG. 13 is installed, when the surveillance camera operates.
Figure 17:
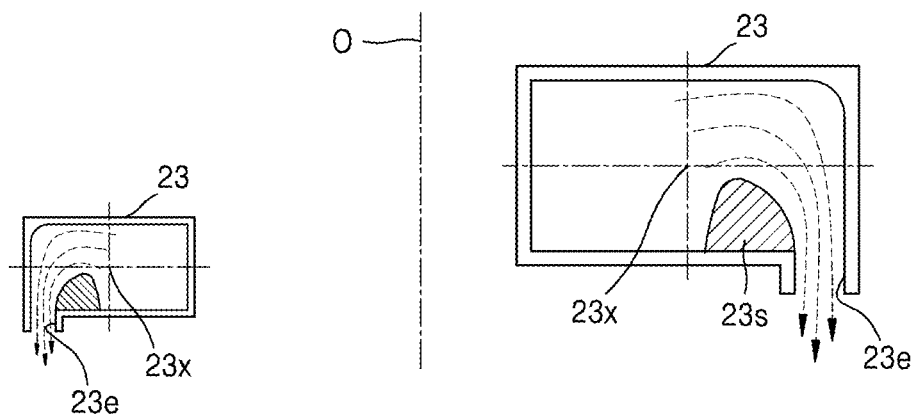
FIG. 17 is a cross-sectional view showing a section of a part of the cooling device for surveillance camera of FIG. 13.

FIG. 13 is a top view of a cooling device for surveillance camera according to another exemplary embodiment, FIG. 14 is a perspective view showing a part of the cooling device for surveillance camera of FIG. 13, including a section of the cooling device for surveillance camera taken along line XIV-XIV, FIG. 15 is a perspective view showing another part of the cooling device for surveillance camera of FIG. 13, including a section of the cooling device for surveillance camera taken along line XV-XV, FIG. 16 is a front view of a surveillance camera in which the cooling device for surveillance camera of FIG. 13 is installed, when the surveillance camera operates, and FIG. 17 is a cross-sectional view showing a section of a part of the cooling device for surveillance camera of FIG. 13.

The cooling device for surveillance camera according to the exemplary embodiment as shown in FIGS. 13 to 17 may include an outer housing 10 surrounding a surveillance camera 7, and a blower 20 positioned on an outer surface 11 of the outer housing 10 and configured to generate cooling air 3 flowing along the outer surface 11.

Referring to FIG. 16, the outer housing 10 may include a case 10b surrounding electronic components generating heat, a head 10a fixing the case 10b on an installation surface, such as a wall or ceiling, and a dome cover 10c of a light transmission material coupled with one end of the case 10b to transmit light and configured to protect the surveillance camera 7 from, for example, the elements.

The head 10a of the outer housing 10 may also function as a passage for a power cable for supplying electricity to the surveillance camera 7 and an electrical cable including signal lines for transmitting signals to the surveillance camera 7.

The case 10b of the outer housing 10 may surround electronic components (which generate heat), such as a power supply for supplying power to the surveillance camera 7 and a control circuit board for controlling the surveillance camera 7 and processing photographed images, to accommodate and protect the electronic components. Also, the case 10b may dissipate heat generated from the electronic components to the exterior of the outer housing 10.

The blower 20 may include a cooling fan 21 rotating to generate cooling air 3, and a nozzle 23 for discharging the cooling air 3 generated by the cooling fan 21 toward a direction following the contour of the outer surface 11 of the outer housing 10. Although no cooling fan is shown in FIG. 16, the same cooling fan as that included in the cooling device for surveillance camera according to the exemplary embodiment of the disclosure shown in FIGS. 11 and 12 may be used in the cooling device for surveillance camera of FIG. 16.

The outer surface 11 of the outer housing 10 may be curved radially along a circumferential direction with respect to a central axis O of the external housing 10. The central axis O of the outer housing 10 may be a geometrical center of the outer housing 10, and pass the surveillance camera 7 accommodated in the outer housing 10. A cross section shape of the outer housing 10 may be symmetrical with respect to the central axis O.

The blower 20 may also include a shroud 22 surrounding the cooling fan and the shroud may include an inlet for receiving outside air. One end 23a of the nozzle 23 may be connected to the shroud 22 and the other end 23b of the nozzle 23 may extend along the circumferential direction of the outer surface 11 of the outer housing 10.

The nozzle 23 may discharge cooling air 3 such that the cooling air 3 flows along the outer surface 11 of the outer housing 10. The nozzle 23 may be connected to the shroud 22 and may be in the shape of a hollow tube. The nozzle 23 may surround at least one area of the outer surface 11 of the outer housing 10 along the circumferential direction of the outer housing 10. The nozzle 23 may include an outlet 23e for discharging cooling air 3 toward the outer surface 11 of the outer housing 10.

The one end 23a of the nozzle 23 may be connected to the shroud 22 by a transition pipe 27. The nozzle 23 may extend along the circumferential direction of the outer housing 10 from the one end 23a to the other end 23b.

The transition pipe 27 may extend with an inclination with respect to the central axis of the outer housing 10 to connect the one end 23a of the nozzle 23 to the shroud 22 positioned at another location on the outer surface 11 of the outer housing 10.

Referring to FIG. 16, the blower 20 including the shroud 22, the cooling fan 21, and the nozzle 23 may be positioned on the head 10a of the outer housing 10, and the outlet 23e of the nozzle 23 may open toward the case 10b coupled with a lower portion of the head 10a.

The nozzle 23 may surround the entire circumference of the outer surface 11 of the outer housing 10, and the other end 23b of the nozzle 23 on the outer surface 11 may overlap with the shroud 22.

According to the structure of the nozzle 23, cooling air 3 discharged from the outlet 23e of the nozzle 23 may be dispersed equally over the entire surface area of the outer surface 11 of the outer housing 10.

Referring to FIGS. 13 to 15, a cross section area of the inside of the nozzle 23 may be reduced gradually toward the other end 23b of the nozzle 23 from the one end 23a of the nozzle 23. A width of the outlet 23e of the nozzle 23 may change in a direction in which the nozzle 23 extends. For example, the width of the outlet 23e of the nozzle 23 may be reduced gradually toward the other end 23b of the nozzle 23 from the one end 23a of the nozzle 23, or may increase gradually toward the other end 23b of the nozzle 23 from the one end 23a of the nozzle 23.

Also, in the inside of the nozzle 23, a protrusion 23s may extend along the extension direction of the nozzle 23. The protrusion 23s may meet the outlet 23e of the nozzle 23 to form a passage connected to the outlet 23e in the inside space of the nozzle 23.

A cross-sectional area of the protrusion 23s may change along the extension direction of the nozzle 23 so that the protrusion 23s may adjust a size of the passage connected to the outlet 23e in the inside space of the nozzle 23. For example, the cross-sectional area of the protrusion 23s may be reduced toward the other end 23b of the nozzle 23 from the one end 23a of the nozzle 23, or may be increased toward the other end 23b of the nozzle 23 from the one end 23a of the nozzle 23.

Although the cross section area of the protrusion 23s is reduced or increased gradually along the extension direction of the nozzle 23, the exemplary embodiment is not limited to the shape of the protrusion 23s in which the cross-sectional area of the protrusion 23s changes. For example, when there is a part (a high-temperature part) where a temperature increases rapidly by an electronic component accommodated in the outer housing 10 in an area extending along the circumferential direction on the outer surface 11 of the outer housing 10, a large amount of cooling air may be discharged to the high-temperature part by reducing the cross section area of the protrusion 23s corresponding to the high-temperature area.

Referring to FIG. 17, when the nozzle 23 extends in the circumferential direction with respect to the central axis O of the outer housing 10, a central location 23x of the cross section of the nozzle 23 may move along a direction that is parallel to the central axis O of the outer housing 10.

In FIG. 17, a central location 23x of the cross section of the nozzle 23 shown to the left of the central axis O may be positioned below a central location 23x of the cross section of the nozzle 23 shown to the right of the central axis O, in a direction that is parallel to the central axis O. Due to the change in shape of the nozzle 23, when the nozzle 23 extends along the circumferential direction of the outer housing 10, the other end 23b of the nozzle 23 may overlap with the shroud 22, as shown in FIG. 16.

Because the nozzle 23 is in the shape of a ring extending along the circumferential direction of the outer housing 10 to surround the entire of the outer surface 11, cooling air supplied to the nozzle 23 from the shroud 22 may move along the nozzle 23 to generate a pressure difference in air by a centrifugal force, and thereby the cooling air may be discharged to the outside of the nozzle 23 through the outlet 23e of the nozzle 23.

Figure 18:
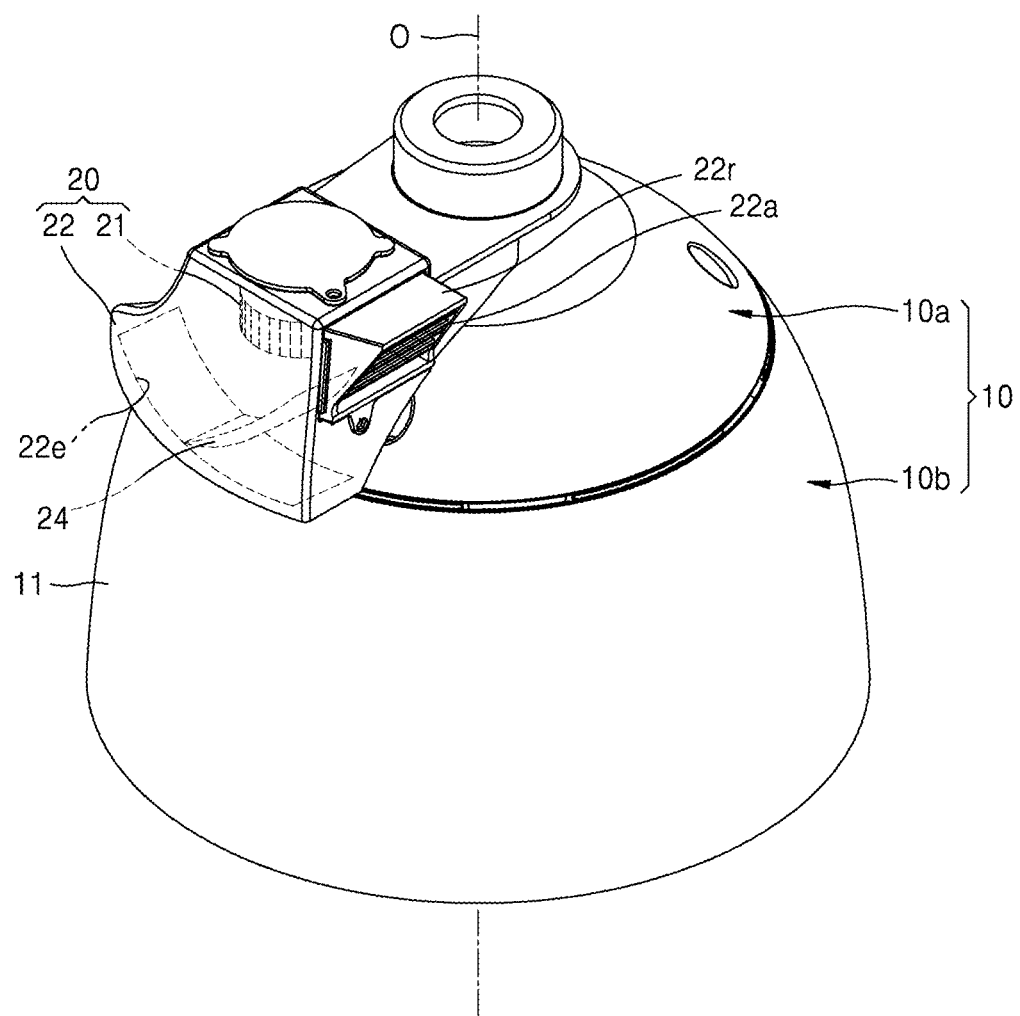
FIG. 18 is a perspective view of a cooling device for surveillance camera according to another exemplary embodiment of the disclosure.
Figure 19:
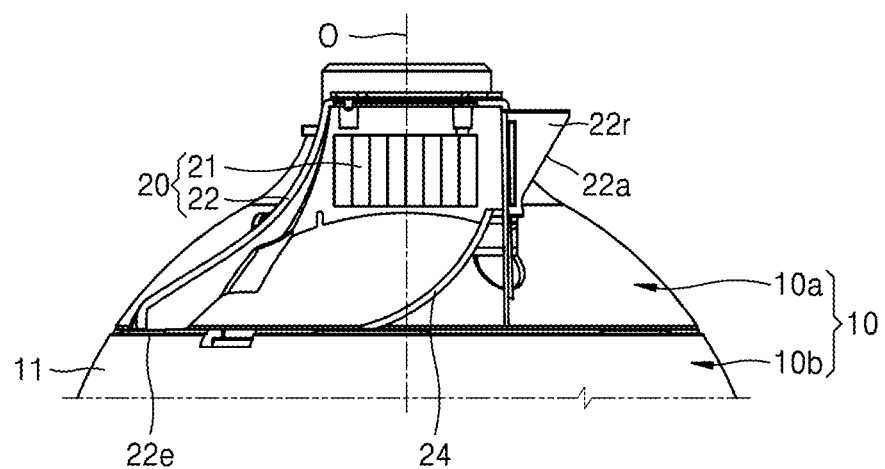
FIG. 19 is a front view of the cooling device for surveillance camera of FIG. 18.

FIG. 18 is a perspective view of a cooling device for surveillance camera according to another exemplary embodiment, and FIG. 19 is a front view of the cooling device for surveillance camera of FIG. 18.

The cooling device for surveillance camera according to the exemplary embodiment as shown in FIGS. 18 and 19 may include an outer housing 10 surrounding a surveillance camera 7, and a blower 20 positioned on an outer surface 11 of the outer housing 10 and configured to generate cooling air flowing along the outer surface 11.

The outer housing 10 may include a case 10b surrounding electronic components generating heat, a head 10a fixing the case 10b on an installation surface, such as a wall or ceiling, and a dome cover of a light transmission material coupled with one end of the case 10b to transmit light and configured to protect the surveillance camera 7 from, for example, the external elements. Although the dome cover is not shown in FIGS. 18 and 19, a dome cover of the same configuration as the dome cover of the embodiment shown in FIG. 1 may be applied to the embodiment shown in FIGS. 18 and 19.

The head 10a of the outer housing 10 may also function as a passage for a power cable for supplying electricity to the surveillance camera 7 and an electrical cable including signal lines for transmitting signals to the surveillance camera 7.

The case 10b of the outer housing 10 may surround electronic components (which generate heat), such as a power supply for supplying power to the surveillance camera 7 and a control circuit board for controlling the surveillance camera 7 and processing photographed images, to accommodate and protect the electronic components. Also, the case 10b may dissipate heat generated from the components to the exterior of the outer housing 10.

The blower 20 may include a cooling fan 21 rotating to generate cooling air, and a shroud 22 surrounding the cooling fan 21 and including an inlet 22a for receiving outside air and an outlet 22e for discharging cooling air generated by the cooling fan 21 toward a direction following the contour of the outer surface 11 of the outer housing 10. The inlet 22a for introducing external air to the shroud 22 may be formed in a ventilation grill 22r formed in one side of the shroud 22.

The outer surface 11 of the outer housing 10 may be radially curved along the circumferential direction with respect to the central axis of the outer housing 10. In the inside of the shroud 22, a vane 24 being inclined with respect to the circumferential direction of the outer housing 10 may be positioned. The vane 24 may guide a moving direction of cooling air generated by the cooling fan 21 to cause the cooling air to be discharged in a direction inclined with respect to the circumferential direction of the housing 10.

The vane 24 may include a heat conductive material capable of conducting heat and be in contact with the outer surface 11 of the outer housing 10. The vane 24 may be made of a metal material, such as, for example, aluminum, copper, stainless steel, etc., capable of conducting heat. The vane 24 may be in direct contact with the outer surface 11 of the outer housing 10 to cool the outer surface 11 of the outer housing 10 together with the cooling air passing through the outlet 22e. That is, the heat transferred to the outer housing 10 may raise a surface temperature of the vane 24, and cooling air passing through the outlet 22e may contact a surface of the vane 24 to thereby cool the vane 24.

Figure 20:
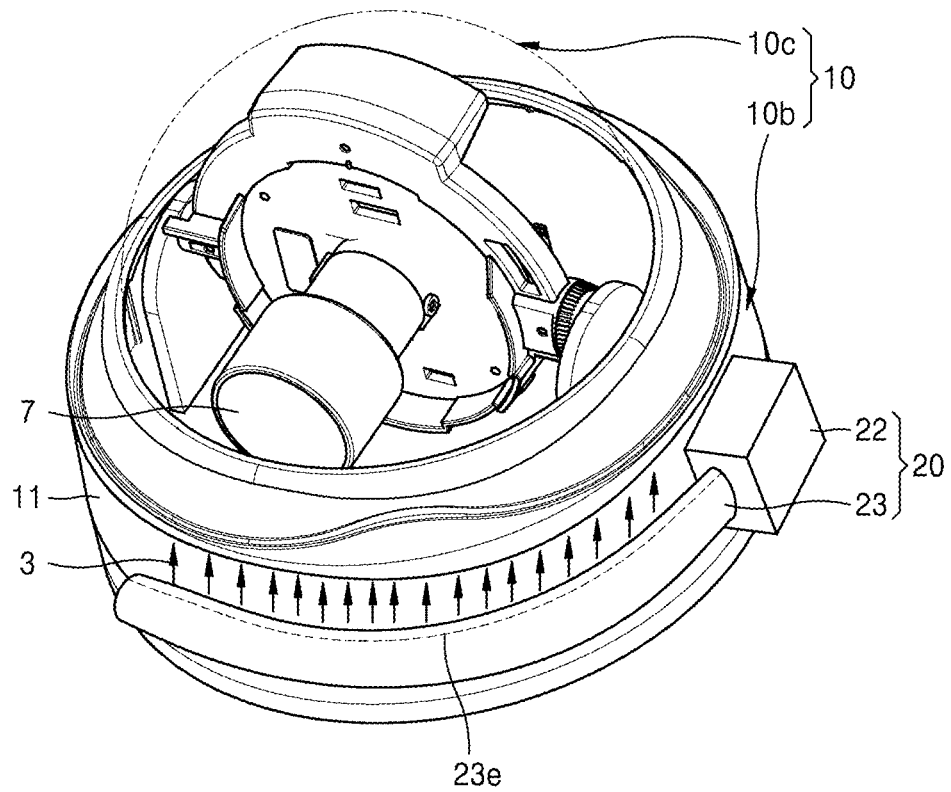
FIG. 20 is a perspective view of a cooling device for surveillance camera according to another exemplary embodiment.

FIG. 20 is a perspective view of a cooling device for surveillance camera according to another exemplary embodiment. In the cooling device for surveillance camera according to the embodiment of the disclosure shown in FIG. 20, a surveillance camera 7 and an outer housing 10 may form a dome shape.

The cooling device for surveillance camera of FIG. 20 may include an outer housing 10 surrounding a surveillance camera 7, and a blower 20 positioned on an outer surface 11 of the outer housing 10 and configured to generate cooling air 3 flowing along the outer surface 11.

The outer housing 10 may include a case 10b surrounding components generating heat, a head fixing the case 10b on an installation surface, such as a wall or ceiling, and a dome cover 10c of a light transmission material coupled with one end of the case 10b to transmit light and configured to protect the surveillance camera 7. The case 10b may include a heat conductive material transmitting heat in at least one portion.

The case 10b of the outer housing 10 may surround electronic components, such as a power supply 8 for supplying power to the surveillance camera 7 and a control circuit board 9 for controlling the surveillance camera 7 and processing photographed images, to accommodate and protect the electronic components. Also, the case 10b may dissipate heat generated from the electronic components to the outside of the outer housing 10.

The blower 20 may include a cooling fan rotating to generate cooling air 3, and a nozzle 23 for discharging the cooling air 3 generated by the cooling fan 21 toward a direction following the contour of the outer surface 11 of the outer housing 10. Although no cooling fan is shown in FIG. 20, the same cooling fan as that included in the cooling device for surveillance camera according to the exemplary embodiment shown in FIGS. 11 and 12 may be used in the cooling device for surveillance camera of FIG. 20.

The blower 20 may include a shroud 22 surrounding the cooling fan and the shroud 22 includes an inlet for receiving outside air. One end of the nozzle 23 may be connected to the shroud 22 and the other end of the nozzle 23 may extend along the circumferential direction of the outer surface 11 of the outer housing 10.

The nozzle 23 may discharge cooling air 3 such that the cooling air 3 flows along the outer surface 11 of the outer housing 10. The outer surface 11 of the outer housing 10 may be radially curved along a circumferential direction with respect to a central axis of the external housing 10. The nozzle 23 may be connected to the shroud 22, and be in the shape of a hollow tube. The nozzle 23 may surround at least one area of the outer surface 11 of the outer housing 10 along the circumferential direction of the outer housing 10. The nozzle 23 may include an outlet 23e for discharging cooling air toward the outer surface 11 of the outer housing 10.

According to the cooling device for surveillance camera of the above-described configuration, heat generated by the surveillance camera 7 and transferred to the case 10b of the outer housing 10 may be effectively cooled by cooling air 3 generated by the blower 20.

Figure 21:
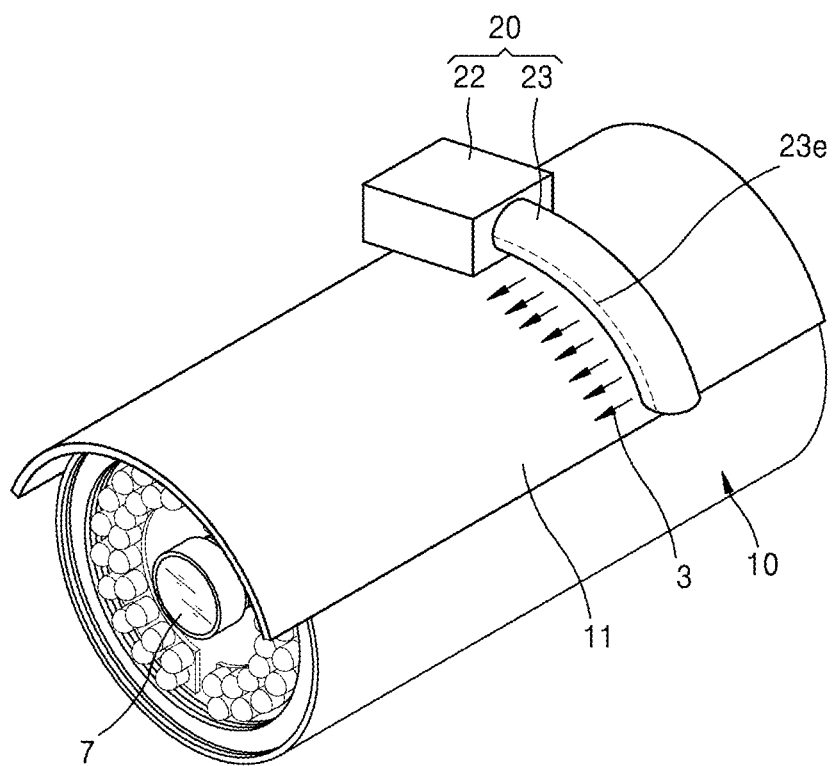
FIG. 21 is a perspective view of a cooling device for surveillance camera according to another exemplary embodiment.

FIG. 21 is a perspective view of a cooling device for surveillance camera according to another exemplary embodiment. In the cooling device for surveillance camera according to the exemplary embodiment shown in FIG. 21, a surveillance camera 7 and an outer housing 10 may form a cylindrical shape. However, the entire shape of the camera 7 and the outer housing 10 is not limited to the cylindrical shape. For example, the entire shape of the camera 7 and the outer housing 10 may be in the shape of a container with a quadrangular section.

The cooling device for surveillance camera according to the exemplary embodiment of the disclosure as shown in FIG. 21 may include an outer housing 10 surrounding the surveillance camera 7, and a blower 20 positioned on an outer surface 11 of the outer housing 10 and configured to generate cooling air 3 flowing along the outer surface 11.

The outer housing 10 may surround electronic components, such as the surveillance camera 7, a power supply for supplying power to the surveillance camera 7 and a control circuit board for controlling the surveillance camera 7 and processing photographed images, to accommodate and protect the electronic components. Also, the outer housing 10 may dissipate heat generated from the electronic components to the exterior of the outer housing 10.

The blower 20 may include a cooling fan rotating to generate cooling air 3, a shroud 22 surrounding the cooling fan, and a nozzle 23 connected to the shroud 22 and configured to discharge the cooling air 3 generated by the cooling fan toward a direction following the contour of the outer surface 11 of the outer housing 10 extends. Although no cooling fan is shown in FIG. 21, the same cooling fan as that included in the cooling device for surveillance camera according to the exemplary embodiment shown in FIGS. 11 and 12 may be used in the cooling device for surveillance camera of FIG. 21.

One end of the nozzle 23 may be connected to the shroud 22 and the other end of the nozzle 23 may extend along the circumferential direction of the outer surface 11 of the outer housing 10. When the outer housing 10 is in the shape of a container with a quadrangular section, the nozzle 23 may extend in a straight line along the outer surface 11 of the outer housing 10.

The nozzle 23 may discharge cooling air such that the cooling air 3 flows along the outer surface 11 of the outer housing 10. The nozzle 23 may be connected to the shroud 22 and may be in the shape of a hollow tube. The nozzle 23 may extend along the outer surface 11 of the outer housing 10. The nozzle 23 may include an outlet 23e for discharging cooling air toward the outer surface 11 of the outer housing 10.

According to the cooling device for surveillance camera of the above-described configuration, the heat generated by the surveillance camera 7 and transferred to the outer surface 11 of the outer housing 10 may be effectively cooled by cooling air 3 generated by the blower 20.

The exemplary embodiments of the disclosure relate to a cooling device for surveillance camera capable of effectively cooling a surveillance camera even in a high-temperature environment.

While exemplary embodiments have been described above, it will be understood by those of ordinary skill in the art that various changes in form and details may be made therein without departing from the spirit and scope of the disclosure as defined by the following claims

What is claimed is:

1. A cooling device for a surveillance system comprising:
an outer housing surrounding a surveillance camera; and
a blower positioned on an outer surface of the outer housing and configured to generate cooling air flowing on an exterior of the outer housing along the outer surface of the outer housing to cool the outer housing,
wherein the blower comprises:
a cooling fan configured to generate the cooling air; and
a nozzle provided at downstream of the cooling fan along a cooling air flow direction and configured to discharge the cooling air on the exterior of the outer housing in a direction following a contour of the exterior of the outer housing,
wherein the outer surface of the outer housing is radially curved along a circumferential direction of the outer housing with respect to a central axis of the outer housing, and
wherein an output end of the nozzle, that is open in a first direction that is perpendicular to the circumferential direction of the outer housing and parallel to the central axis of the outer housing, is configured to discharge the cooling air in a second direction that is inclined with respect to the circumferential direction of the outer housing and extends away from the central axis of the outer housing in at least one view.

2. The cooling device of claim 1, wherein the blower comprises a shroud surrounding the cooling fan and including an inlet for receiving outside air, and
wherein a first end of the nozzle is connected to the shroud, and a second end, that is the output end of the nozzle, opposite to the first end of the nozzle opens toward the outer surface of the outer housing.

3. The cooling device of claim 2, wherein a distance from an inner surface of the nozzle to the outer surface of the outer housing is reduced gradually toward the second end of the nozzle from the first end of the nozzle.

4. The cooling device of claim 3, wherein the nozzle comprises an outlet configured to discharge the cooling air at the second end, and
wherein the outlet extends in the circumferential direction of the outer housing along the outer surface of the outer housing.

5. The cooling device of claim 2, further comprising a vane positioned between the first end of the nozzle and the second end of the nozzle in the nozzle, the vane being configured to guide a flow of the cooling air.

6. The cooling device of claim 5, wherein a vane comprises a plurality of vanes, the plurality of vanes being inclined with respect to the circumferential direction of the outer housing.

7. The cooling device of claim 5, wherein the vane comprises a heat conductive material and is positioned in the outer housing,
wherein the cooling device further comprises a heat transfer plate configured to transfer heat generated from the surveillance camera, and
wherein the vane is connected to the heat transfer plate.

8. The cooling device of claim 7, wherein the outer housing comprises a through hole at a location at which the vane is positioned, and
wherein the vane is connected to the heat transfer plate through the through hole.

9. A cooling device for a surveillance system comprising:
an outer housing surrounding a surveillance camera; and
a blower positioned on an outer surface of the outer housing and configured to generate cooling air flowing on an exterior of the outer housing along the outer surface of the outer housing to cool the outer housing,
wherein the blower comprises:
a cooling fan configured to generate the cooling air; and
a nozzle provided at downstream of the cooling fan along a cooling air flow direction and configured to discharge the cooling air on the exterior of the outer housing in a direction following a contour of the exterior of the outer housing, wherein the outer surface of the outer housing is radially curved along a circumferential direction of the outer housing with respect to a central axis of the outer housing, wherein the nozzle is configured to discharge the cooling air in a direction being inclined with respect to the circumferential direction of the outer housing, wherein the blower comprises a shroud surrounding the cooling fan and including an inlet for receiving outside air, wherein a first end of the nozzle is connected to the shroud, and a second end opposite to the first end of the nozzle opens toward the outer surface of the outer housing, wherein the cooling device comprises a vane positioned between the first end of the nozzle and the second end of the nozzle in the nozzle, the vane being configured to guide a flow of the cooling air, and wherein the vane comprises a heat conductive material and is in contact with the outer surface of the outer housing.

10. A cooling device for a surveillance system comprising:

an outer housing surrounding a surveillance camera; and a blower positioned on an outer surface of the outer housing and configured to generate cooling air flowing on an exterior of the outer housing along the outer surface of the outer housing to cool the outer housing, wherein the blower comprises:
  a cooling fan configured to generate the cooling air; and
  a nozzle provided at downstream of the cooling fan along a cooling air flow direction and configured to discharge the cooling air on the exterior of the outer housing in a direction following a contour of the exterior of the outer housing, wherein the outer surface of the outer housing is radially curved along a circumferential direction of the outer housing with respect to a central axis of the outer housing, wherein the blower comprises a shroud accommodating the cooling fan and including an inlet for receiving external air, and wherein the nozzle is connected to the shroud and is a hollow tube, the nozzle surrounds at least one area of the outer surface of the outer housing along the circumferential direction of the outer housing, and the nozzle comprises an outlet for discharging the cooling air toward the outer surface of the outer housing.

11. The cooling device of claim 10, wherein a first end of the nozzle is connected to the shroud, and the nozzle extends toward a second end opposite to the first end of the nozzle from the first end along the circumferential direction of the outer housing.

12. The cooling device of claim 11, wherein a cross-sectional area of the nozzle is reduced from the first end to the second end.

13. The cooling device of claim 11, wherein when the nozzle extends along the circumferential direction of the outer housing, a central location of a cross section area of the nozzle moves along a direction that is parallel to the central axis of the outer housing.

14. The cooling device of claim 13, wherein
  the nozzle surrounds the outer surface of the outer housing along the circumferential direction of the outer housing, and
  the second end of the nozzle overlaps with the shroud on the outer surface of the outer housing.

15. The cooling device of claim 13, further comprising a transition pipe connecting the first end of the nozzle to the shroud, the transition pipe extending with an inclination angle with respect to the central axis of the outer housing.

16. The cooling device of claim 11, further comprising a protrusion extending along an extension direction of the nozzle and adjoining the outlet in the nozzle.

17. The cooling device of claim 16, wherein a cross-sectional area of the protrusion changes along the extension direction of the nozzle from the first end of the nozzle to the second end of the nozzle.

18. The cooling device of claim 11, wherein a width of the outlet is reduced from the first end of the nozzle to the second end of the nozzle from along an extension direction of the nozzle.

* * * * *